United States Patent
Diep et al.

(10) Patent No.: US 10,446,244 B1
(45) Date of Patent: Oct. 15, 2019

(54) ADJUSTING VOLTAGE ON ADJACENT WORD LINE DURING VERIFY OF MEMORY CELLS ON SELECTED WORD LINE IN MULTI-PASS PROGRAMMING

(71) Applicant: SanDisk Technologies LLC, Plano, TX (US)

(72) Inventors: Vinh Diep, San Jose, CA (US); Ching-Huang Lu, Fremont, CA (US); Zhengyi Zhang, Mountain View, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/948,761

(22) Filed: Apr. 9, 2018

(51) Int. Cl.
| | | |
|---|---|---|
| *G11C 11/34* | (2006.01) | |
| *G11C 16/04* | (2006.01) | |
| *G11C 16/34* | (2006.01) | |
| *G11C 16/14* | (2006.01) | |
| *G11C 16/10* | (2006.01) | |
| *G11C 11/56* | (2006.01) | |

(52) U.S. Cl.
CPC ...... *G11C 16/3427* (2013.01); *G11C 16/0483* (2013.01); *G11C 16/10* (2013.01); *G11C 16/14* (2013.01); *G11C 16/3459* (2013.01); *G11C 11/5628* (2013.01); *G11C 11/5671* (2013.01)

(58) Field of Classification Search
CPC . G11C 16/3427; G11C 16/0483; G11C 16/10; G11C 16/14; G11C 16/3459; G11C 11/5628; G11C 11/5671
See application file for complete search history.

(56) References Cited

U.S. PATENT DOCUMENTS

| | | |
|---|---|---|
| 7,561,469 B2 | 7/2009 | Aritome |
| 7,876,611 B2 | 1/2011 | Dutta et al. |
| 7,898,864 B2 | 3/2011 | Dong |
| 8,051,240 B2 | 11/2011 | Dutta et al. |
| 8,441,856 B2 | 5/2013 | Kim et al. |
| 8,767,468 B2 | 7/2014 | Lee et al. |
| 9,286,993 B2 | 3/2016 | Lasser |
| 9,761,318 B1 * | 9/2017 | Kondo .................. G11C 16/08 |
| 2009/0238007 A1 | 9/2009 | Jang |

(Continued)

OTHER PUBLICATIONS

International Search Report & The Written Opinion of the International Searching Authority dated May 15, 2019, International Application No. PCT/U92019/017061.

*Primary Examiner* — Toan K Le
(74) *Attorney, Agent, or Firm* — Vierra Magen Marcus LLP

(57) ABSTRACT

Apparatuses and techniques are described for programming memory cells with a narrow threshold voltage (Vth) distribution in a memory device. In one approach, the final pass of a multi-pass program operation on a word line WLn includes applying a variable voltage to WLn+1 during verify tests on WLn. The variable voltage (Vread) can be an increasing function of the verify voltage on WLn, and thus a function of the data state for which the verify test is performed. In one approach, Vread on WLn+1 is stepped up with each increase in the verify voltage on WLn. The step size in Vread can be the same as, or different than, the step size in the verify voltage. Vread can be different for each different verify voltage, or multiple verify voltages can be grouped for use with a common Vread.

20 Claims, 17 Drawing Sheets

(56) References Cited

U.S. PATENT DOCUMENTS

| | | |
|---|---|---|
| 2010/0061151 A1 | 3/2010 | Miwa et al. |
| 2013/0308390 A1 | 11/2013 | Lee |
| 2014/0003152 A1* | 1/2014 | Sharon ................ G11C 11/5628 365/185.18 |
| 2014/0119126 A1* | 5/2014 | Dutta ................ G11C 11/5628 365/185.19 |
| 2015/0071008 A1 | 3/2015 | Yang et al. |
| 2016/0078954 A1 | 3/2016 | Shirakawa et al. |
| 2016/0343414 A1* | 11/2016 | Lee ........................ G11C 7/00 |
| 2017/0140814 A1 | 5/2017 | Puthenthermadam et al. |
| 2017/0148520 A1* | 5/2017 | Oh ........................ G11C 16/12 |
| 2018/0005698 A1* | 1/2018 | Ueno ................... G11C 11/5628 |
| 2018/0012667 A1 | 1/2018 | Costa |
| 2018/0033492 A1* | 2/2018 | Seo .................... G11C 16/0466 |
| 2018/0090217 A1* | 3/2018 | Park ................... G11C 16/0483 |

* cited by examiner

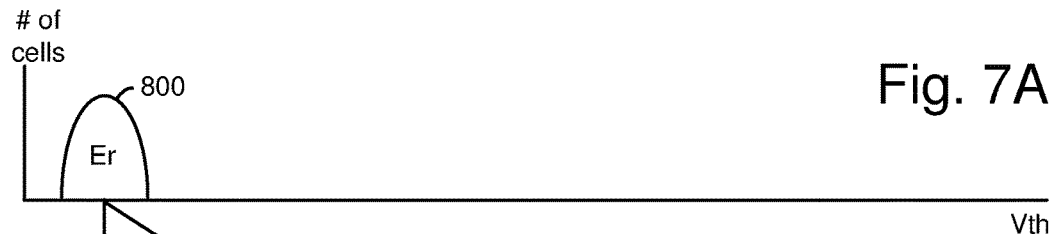
Fig. 7A
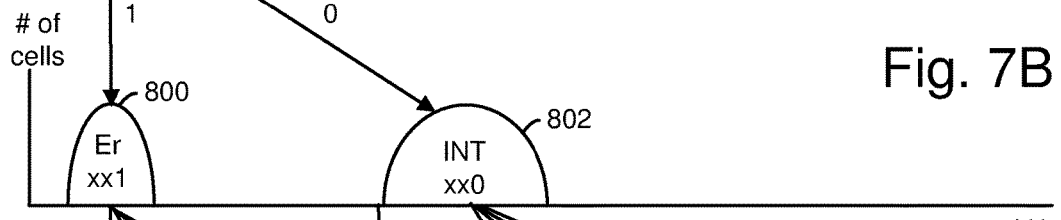
Fig. 7B
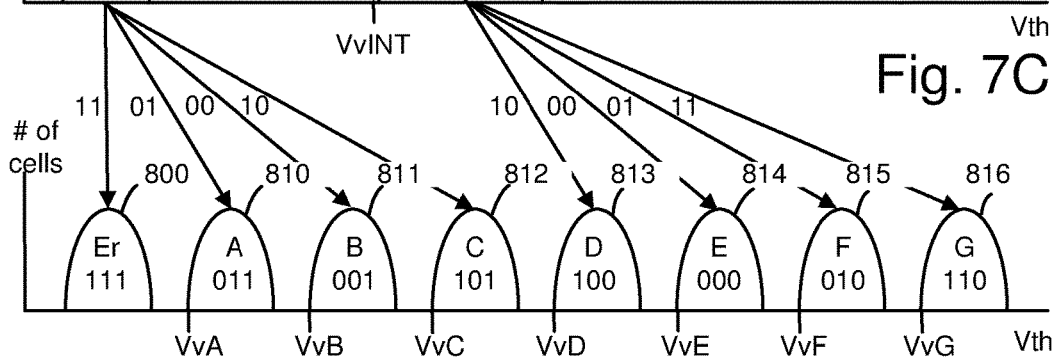
Fig. 7C
Fig. 8
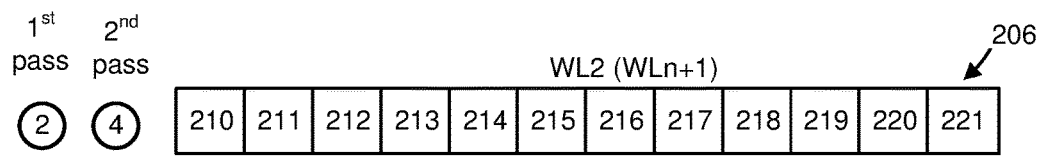
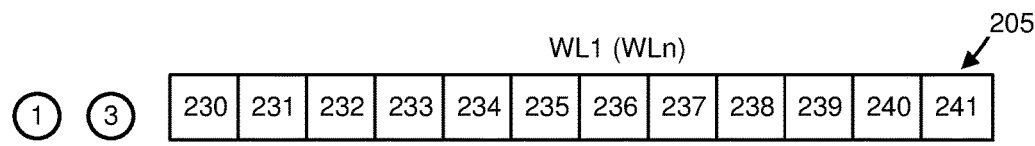

Fig. 9A
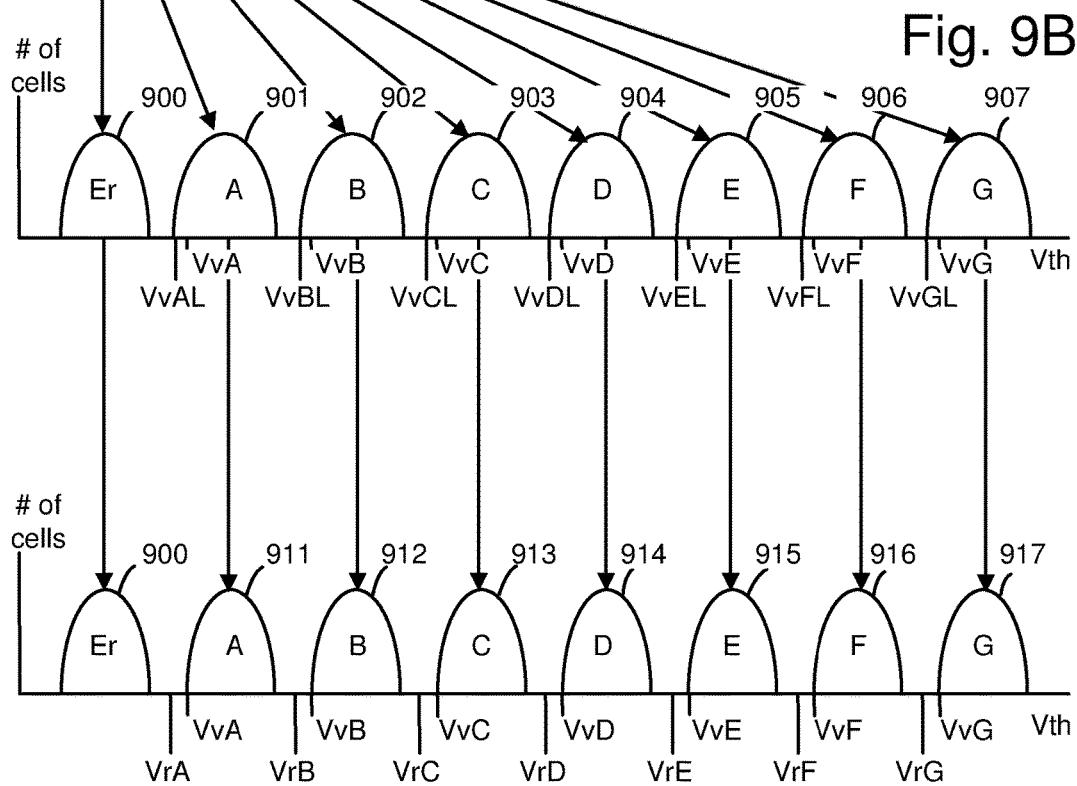
Fig. 9B
Fig. 9C

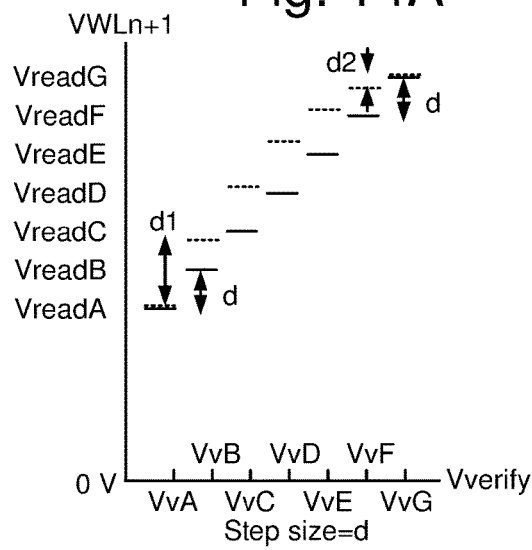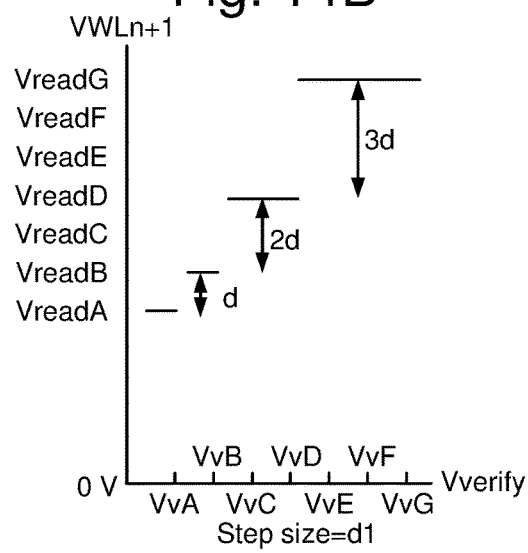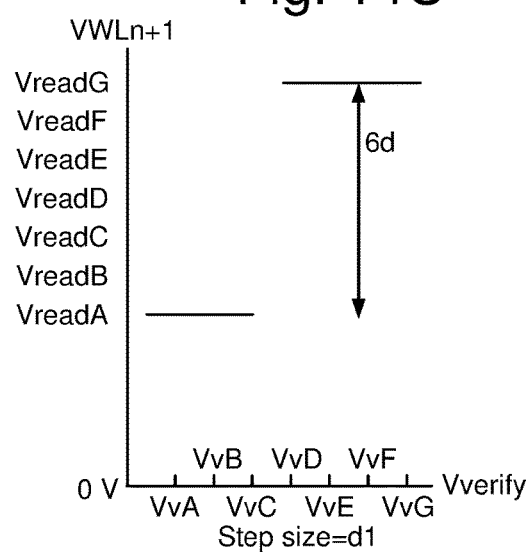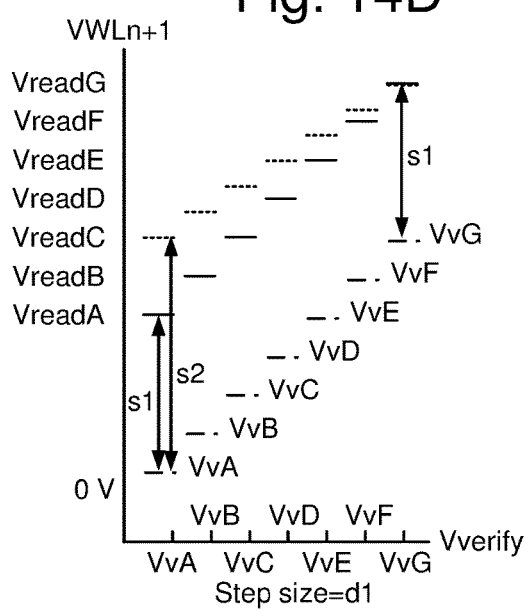

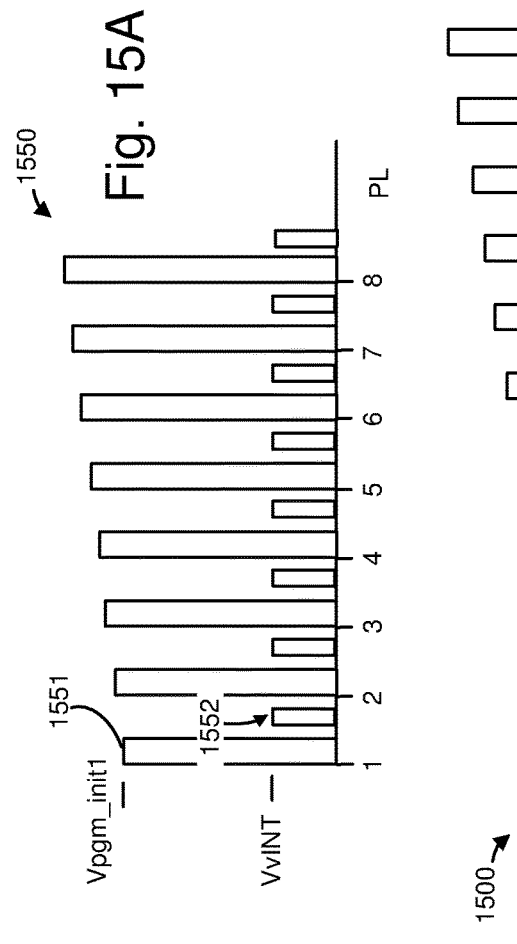
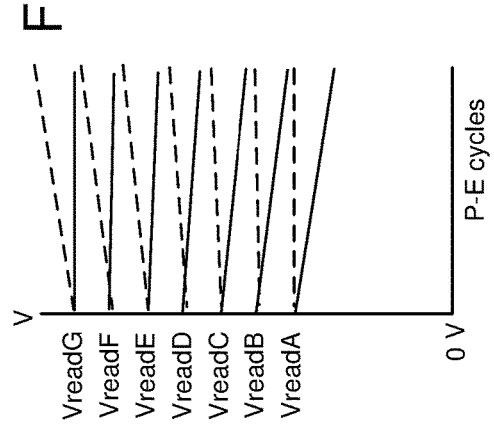
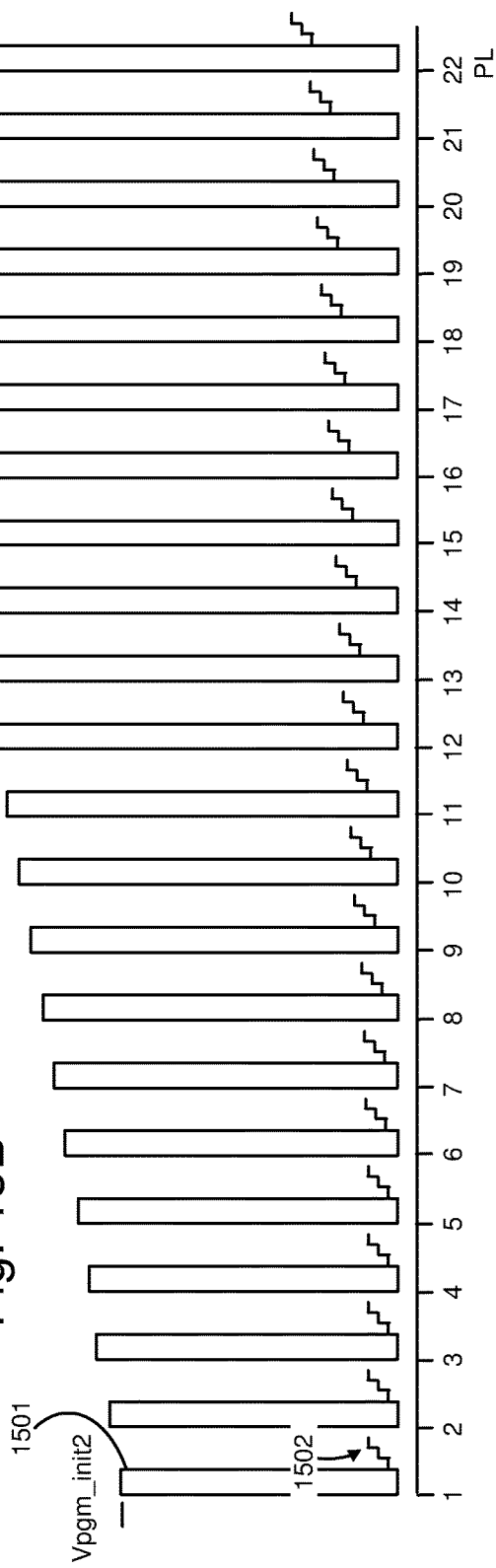

US 10,446,244 B1

ADJUSTING VOLTAGE ON ADJACENT WORD LINE DURING VERIFY OF MEMORY CELLS ON SELECTED WORD LINE IN MULTI-PASS PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND chains (e.g., NAND strings), for instance, where select gate transistors are provided at the ends of a NAND chain to selectively connect a channel of the NAND chain to a source line or bit line. However, various challenges are presented in operating such memory devices.

BRIEF DESCRIPTION OF THE DRAWINGS

FIG. 7A to 7C depict one example of a two-pass program operation, where FIG. 7A depicts a starting Vth distribution, FIG. 7B depicts a Vth distribution after a first program pass and FIG. 7C depicts a Vth distribution after a second program pass.

FIG. 8 depicts an example of a back and forth word line programming order which is compatible with the two-pass program operations of FIGS. 7A-7C and 9A-9C.

FIG. 9A to 9C depict another example of a two-pass program operation, where FIG. 9A depicts a starting Vth distribution, FIG. 9B depicts a Vth distribution after a first, foggy program pass, and FIG. 9C depicts a Vth distribution after a second, fine program pass.

FIG. 14A depicts a plot of Vread (VWLn+1) on WLn+1 during verify tests for WLn memory cells during the final program pass of a multi-pass program operation for WLn, showing how Vread is variable and is an increasing function of the verify voltage, where a different VWLn+1 is provided for each different verify voltage.

FIG. 14B depicts a plot of Vread on WLn+1 during verify tests for WLn memory cells during the final program pass of a multi-pass program operation for WLn, showing how Vread is variable and is an increasing function of the verify voltage, where the number of different verify voltages is greater than the number of different levels of the variable voltage on WLn+1 in a program loop.

FIG. 14C depicts a plot of Vread on WLn+1 during verify tests for WLn memory cells during the final program pass of a multi-pass program operation for WLn, showing how Vread is variable and is an increasing function of the verify voltage, where there are two levels of VWLn+1 in a simplified implementation.

FIG. 14D depicts a plot of Vread on WLn+1 versus Vverify, for the case where a difference by which the variable voltage exceeds the verify voltage is a constant (solid lines) and the case where a difference by which the variable voltage exceeds the verify voltage decreases as the verify voltage increases.

FIG. 14E depicts a plot of Vread on WLn+1 during verify tests for WLn memory cells during the final program pass of a multi-pass program operation for WLn, where Vread is adjusted based on a number of program-erase (P-E) cycles.

FIG. 15A depicts a voltage signal used in the first program pass of FIG. 7B.

FIG. 15B depicts a voltage signal used in a second program pass of FIG. 7C.

DETAILED DESCRIPTION

Figure 1:
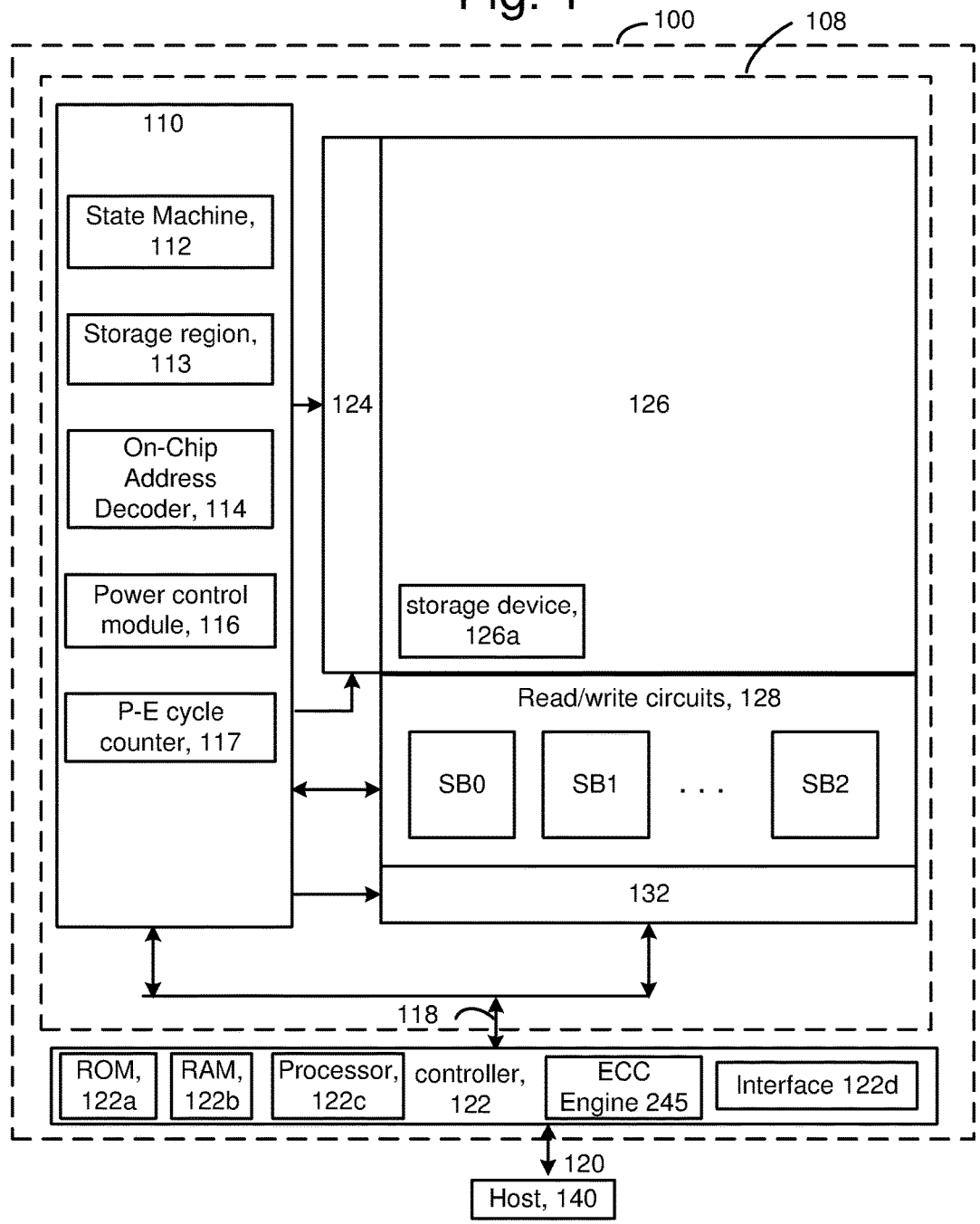
FIG. 1 is a block diagram of an example memory device.

Apparatuses and techniques are described for programming memory cells with a narrow threshold voltage (Vth) distribution in a memory device.

In some memory devices, memory cells are joined to one another such as in NAND chains in a block or sub-block. Each NAND chain comprises a number of memory cells connected in series between one or more drain-end select gate transistors (referred to as SGD transistors), on a drain-end of the NAND chain which is connected to a bit line, and one or more source-end select gate transistors (referred to as SGS transistors), on a source-end of the NAND chain or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND chains in a stack, where the stack comprises alternating conductive and dielectric layers. The conductive layers act as word lines which are connected to the memory cells. Each NAND chain may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Each memory cell may be assigned to a data state according to write data in a program command. Based on the write data, a memory cell will either remain in the erased state or be programmed to an assigned, programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 7C). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

The memory cells can be programmed in one or more program passes. A program pass may include a set of increasing program voltages which are applied to the word line in respective program loops or program-verify iterations, such as depicted in FIGS. 15A and 15B. Verify operations (verify tests) may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

During a program operation, the memory cells are programmed according to a word line programming order. For example, the programming may start at the word line at the source side of the block and proceed to the word line at the drain side of the block. In one approach, each word line is completely programmed in one program pass before programming a next word line. For example, a first word line, WL0, is programmed then a second word line, WL1, is programmed, and so forth. However, the programming of a word line (e.g., WL1) can cause neighbor word line interference for the adjacent, previously programmed word line (e.g., WL0). In particular, due to capacitive coupling, the memory cells connected to WL0 can have their Vth shifted higher due to increases in the Vth of the memory cells connected to WL1, as well as due to the program voltage applied to WL1. See FIG. 10A.

To reduce the program disturb, a multi-pass program operation may be performed in which the memory cells of WLn are partly programmed in a first program pass, then the memory cells of WLn+1 are partly programmed in a first program pass, then the memory cells of WLn are fully programmed in a second program pass, then the memory cells of WLn+1 are fully programmed in a second program pass. This approach involves a back and forth word line programming order. See FIG. 8. However, the Vth distributions of the memory cells connected to WLn can still be shifted higher due to neighbor word line interference. The upshift can be high enough to cause read errors.

Techniques provided herein address the above and other issues. In one approach, the final pass of a multi-pass program operation on a word line WLn includes applying a variable voltage to WLn+1 during verify tests on WLn. The variable voltage (Vread) can be an increasing function of the verify voltage on WLn, and thus a function of the data state for which the verify test is performed. In one approach, Vread on WLn+1 is stepped up with each increase in the verify voltage on WLn. See FIGS. 14A and 18A. The step size in Vread can be the same as, or different than, the step size in the verify voltage. Vread can be different for each different verify voltage, or multiple verify voltages can be grouped for use with a common Vread. See FIGS. 14B and 14C. In another option, Vread is adjusted as a function of program-erase cycles. See FIG. 14E.

By lowering Vread on WLn+1 during a verify test for memory cells on WLn having a low assigned data state, these memory cells can be locked out or pass a verify test at a different Vth level according to the state of the adjacent memory cell on WLn+1. In particular, a memory cell on WLn which has a low data state will be locked out at a lower Vth when the adjacent memory cell on WLn+1 is in a relatively high data state, compared to when the adjacent memory cell on WLn+1 is in a relatively low data state. This compensates for the fact that the low state memory cells of WLn will be subject to a relatively large amount of neighbor word line interference, compared to high state memory cells of WLn, when the memory cells of WLn+1 undergo their final program pass. As a result, a narrow final Vth distribution can be achieved since widening of the upper tail of the Vth distribution is reduced. For example, compare the Vth distribution width w3 in FIG. 10C to the larger Vth distribution width w4 in FIG. 10A.

The benefit of a narrow final Vth distribution can be obtained for memory cells of each assigned data state by adjusting the Vread on WLn+1 to an optimal level during the verify tests on WLn. The Vread on WLn+1 can be an increasing function of the verify voltage on WLn, e.g., Vread becomes higher as the verify voltage becomes higher.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB0, SB1, SB2 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), and a program erase (P-E) cycle counter 117. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. See also FIG. 4.

The (P-E) cycle counter 117 may also track P-E cycles in a block for use in adjusting Vread levels on an unselected word line during verify tests on a selected word line, such as depicted in FIG. 14E. This adjustment can compensate for changes in memory cell performance as P-E cycles increase.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks SB0, SB1, . . . , SB2, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND chain is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The techniques described herein are applicable to both 2D and 3D memory structures. The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND chain within a single horizontal (e.g., x-y) memory device level. Alternatively, the memory elements may be coupled together to form a vertical NAND chain that traverses across multiple horizontal memory device levels. Other 3D configurations can be envisioned wherein some NAND chains contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
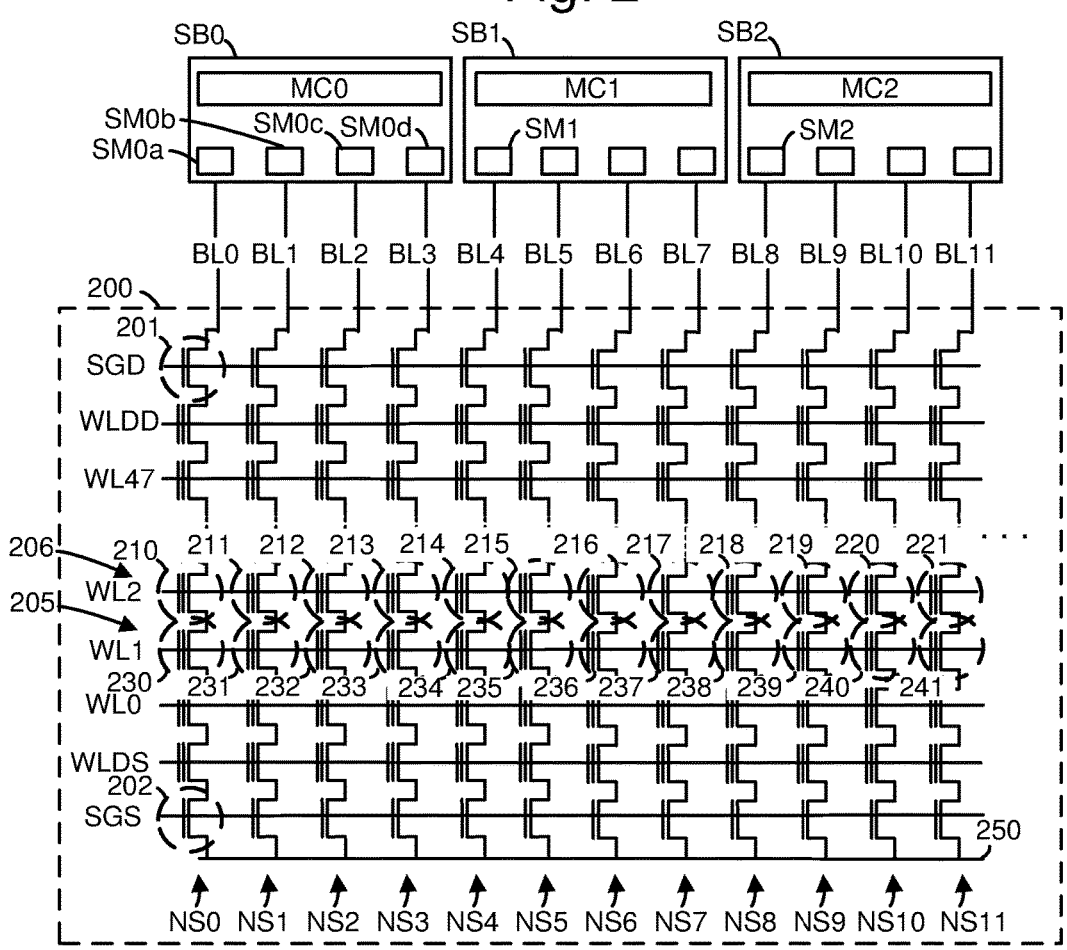
FIG. 2 depicts a block of NAND flash memory cells in the memory structure 126 of FIG. 1 and associated sense blocks SB0, SB1 and SB2.

FIG. 2 depicts a block of NAND flash memory cells in the memory structure 126 of FIG. 1 and associated sense blocks SB0, SB1 and SB2. The memory structure, such as a memory array, can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 250. For example, NS0 includes a source side select gate transistor 202 and a drain side select gate transistor 201. The NAND strings may also include a drain side dummy word line WLDD and a source side dummy word line WLDS.

An example set 205 of memory cells includes memory cells 230-241 which are connected to WL1. For example, WL1 could be a selected word line which is selected for programming and the example memory cells can be selected memory cells which are selected for programming. Another example set 206 of memory cells includes memory cells 210-221 which are connected to WL2. For example, WL2 could be an unselected word line which is adjacent to WL1 and programmed after WL1 in a multi-pass program operation. WL1 may be referred to as WLn and WL2 may be referred to as WLn+1 in some examples below, such as in FIG. 8. Forty eight word lines, for example, WL0-WL47, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block SB0, SB1 and SB2 includes a memory controller, MC0, MC1 and MC2, respectively. Each sense block also includes a sense module for each NAND string. Representative sense modules SM0a-SM0d, SM1 and SM2 are depicted in SB0, SB1 and SB2, respectively. Example details of SB0 are provided in FIG. 3.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge memory cell in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3:
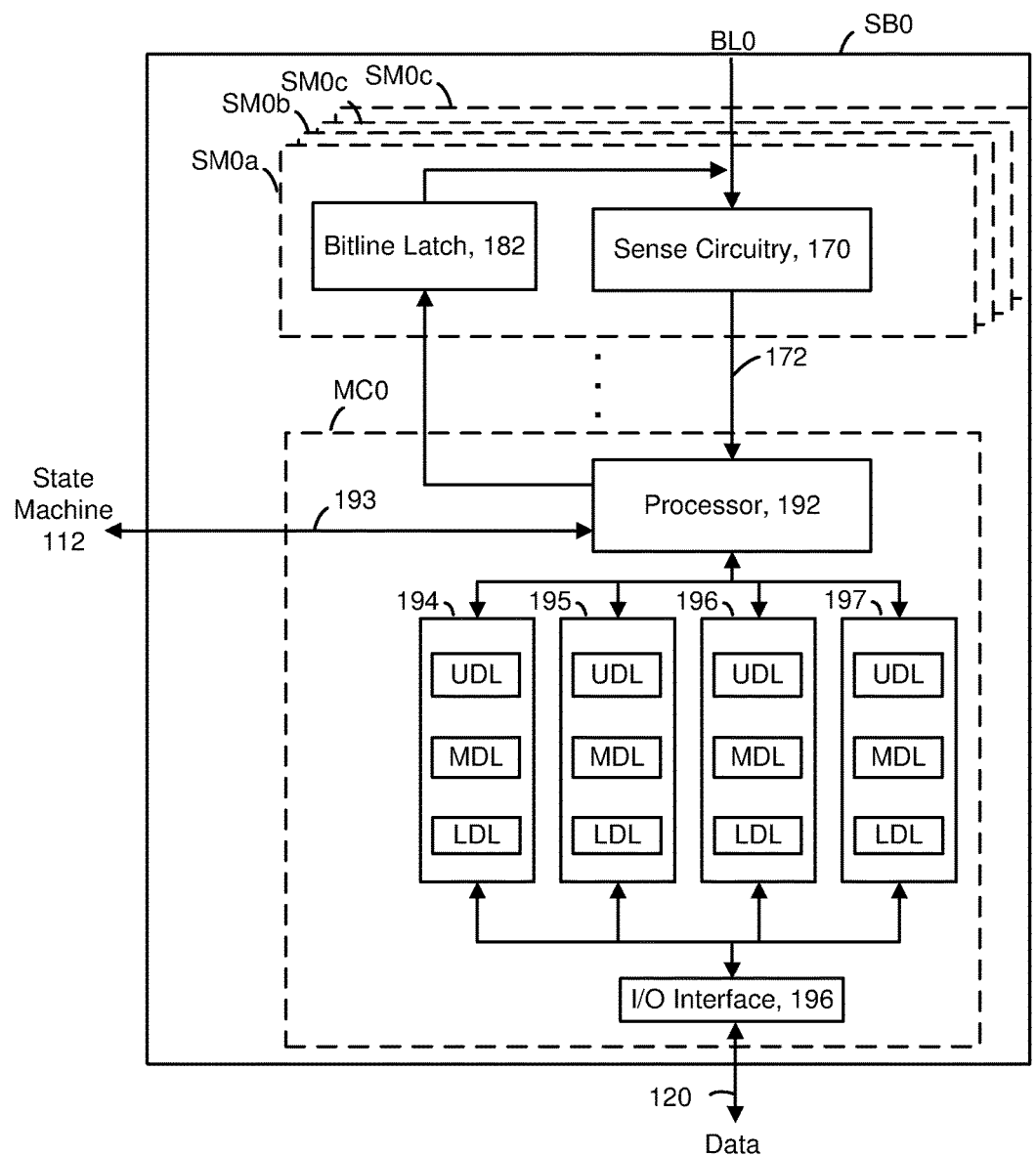
FIG. 3 is a block diagram depicting one embodiment of the sense block SB0 of FIGS. 1 and 2.

FIG. 3 is a block diagram depicting one embodiment of the sense block SB0 of FIGS. 1 and 2. SB0 is partitioned into one or more core portions, referred to as sense modules (e.g., SM0a-SM0d) or sense amplifiers, and a common portion, referred to as a managing circuit (MC0). In one embodiment, there is a separate sense module for each bit line and one common managing circuit for a set of multiple, e.g., four, sense modules SM0a-SM0d. Each of the sense modules in a group communicates with the associated managing circuit via a data bus 172. Thus, there are one or more managing circuits which communicate with the sense modules of a set of memory cells.

The sense module SM0a, for example, comprises sense circuitry 170 that performs sensing by determining whether a conduction current in a connected bit line is above or below a predetermined threshold level. SM0a includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming.

Managing circuit MC0 comprises a processor 192, four example sets of data latches (DLs) 194-197 and an I/O Interface 196 coupled between the set of data latches 194 and data bus 120. One set of data latches can be provide for each sense module, and data latches identified by LDL, MDL and UDL may be provided for each set. LDL, MDL and UDL store a bit for a lower page (LP), middle page (MP) and upper page (UP) of write data, respectively, in a memory which stores three bits of data in each memory cell.

Processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed memory cell. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP, MP and UP data latches. The program operation, under the control of the state machine, comprises a series of programming voltage pulses applied to the control gates of the addressed memory cells. Each program pulse is followed by a read back (verify) to determine if the memory cell has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the memory cell coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4:
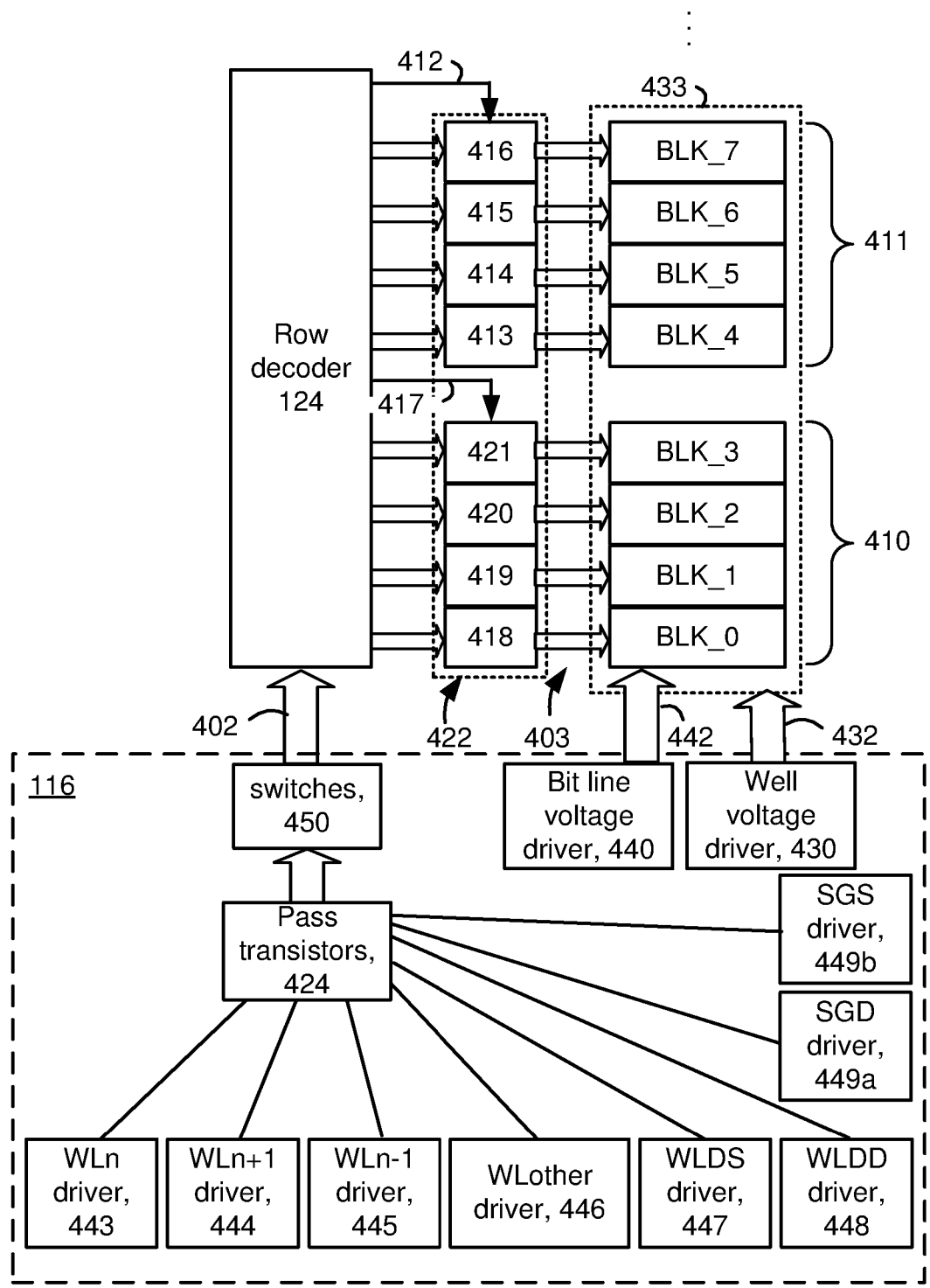
FIG. 4 depicts an example implementation of the power control module 116 of FIG. 1 for providing voltages to blocks of memory cells.

FIG. 4 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line driver (WLn driver 443), which provides a voltage on a data word line selected during a program or read operation, a WLn+1 driver 444 for a first adjacent unselected data word line (adjacent to WLn and after WLn in a word line programming order), a WLn−1 driver 445 for a second adjacent unselected data word line (adjacent to WLn and before WLn in a word line programming order), a WLother driver 446 for other unselected data word lines, a WLDS driver 447 for source side dummy word lines and a WLDD driver 448 for drain side dummy word lines. The voltage drivers can also include an SGD driver 449*a* for the SGD transistors and a SGS driver 449*b* for the SGS transistors.

The various components, including the row decoder, may receive commands from a controller such as the state machine 112 or the controller 122 to perform the functions described herein.

Figure 6A:
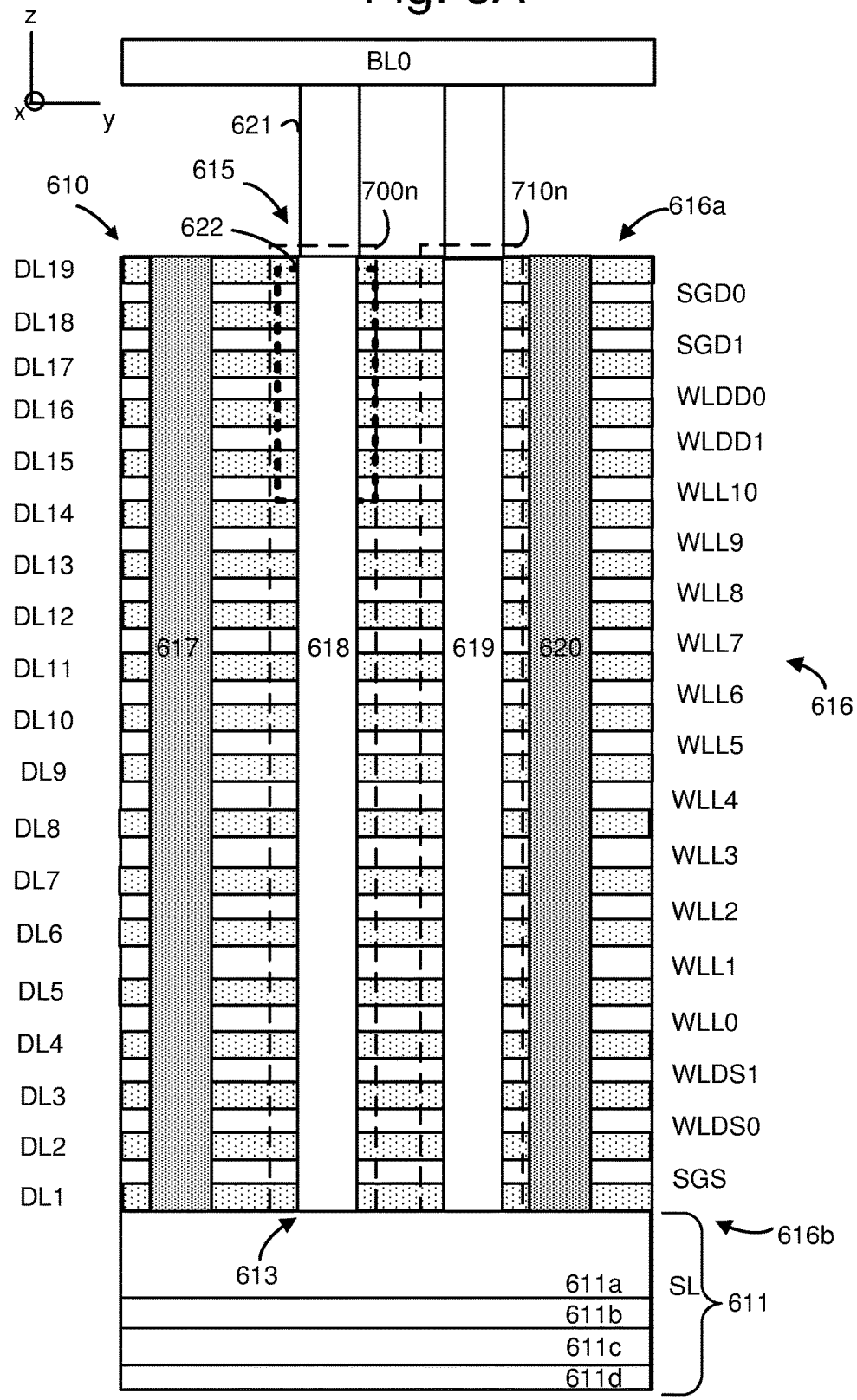
FIG. 6A depicts an example cross-sectional view of a portion of the block BLK0 of FIG. 5.
Figure 6B:
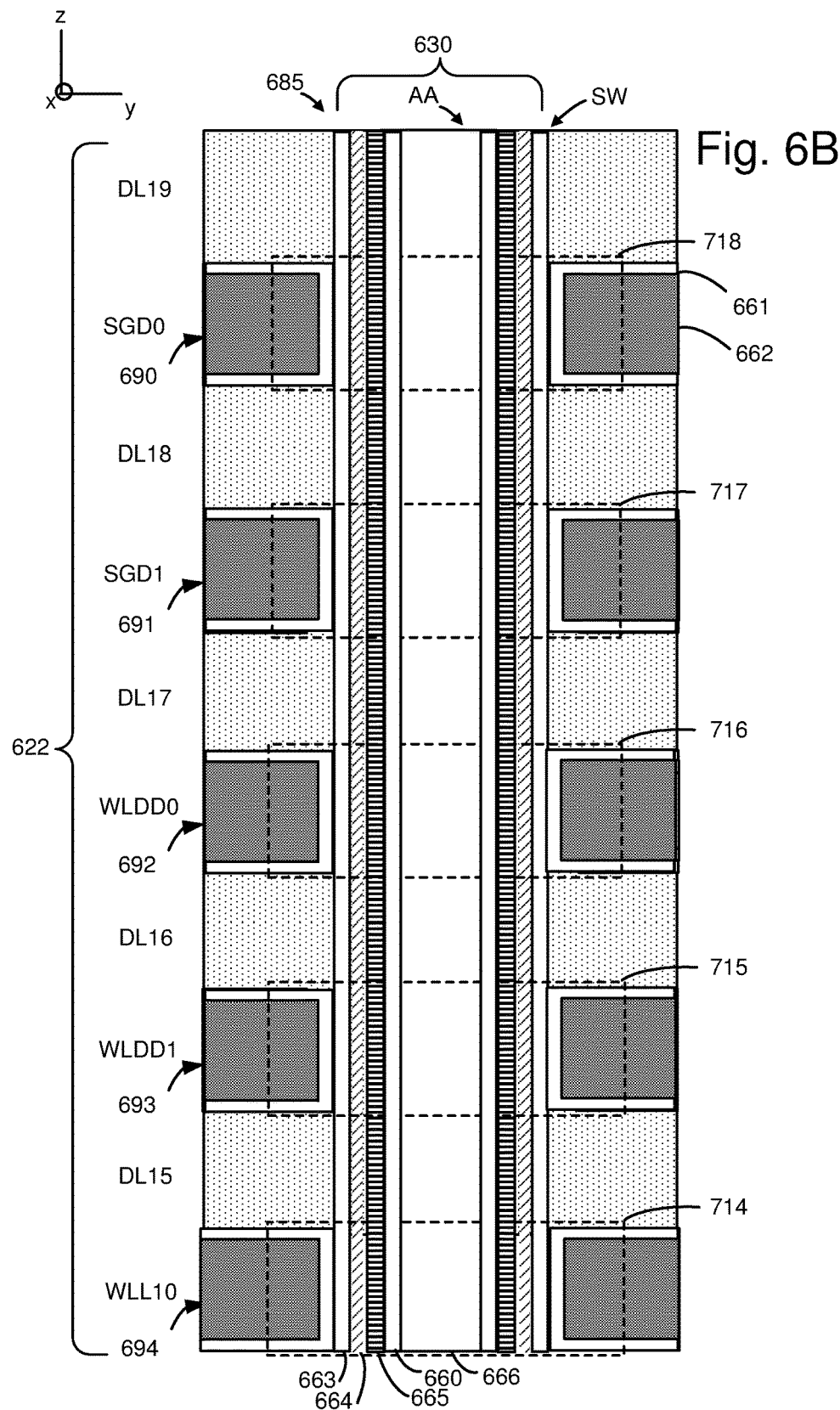
FIG. 6B depicts a close-up view of the region 622 of the stack of FIG. 6A.

A well voltage driver 430 provides a voltage Vsource to the well region 611*a* (see FIG. 6A) in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 6A and 6B, sets of connected memory cells may be arranged in NAND chains which extend vertically upward from the substrate. The bottom (or source end) of each NAND chain is in contact with the well region, and the top end (or drain end) of each NAND chain is connected to a respective bit line, in one approach.

Figure 5:
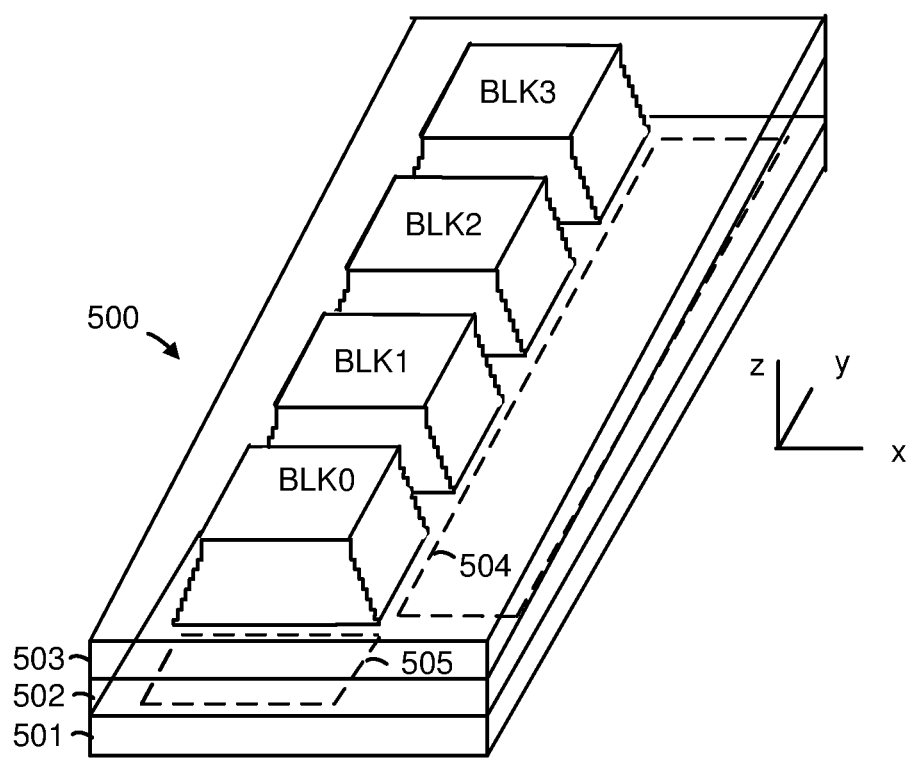
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 6A depicts an example cross-sectional view of a portion of the block BLK0 of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND chains 700n and 710n are depicted. Each NAND chain encompasses a memory hole 618 or 619 which is filled with materials which form memory cells adjacent to the word lines. Region 622 of the stack is shown in greater detail in FIG. 6B.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND chain 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND chain.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND chain.

Each NAND chain or set of connected transistors comprises a channel which extends continuously from one or more source-end select gate transistors to one or more drain-end select gate transistors. The channel 700a is continuous in that it is uninterrupted and can therefore provide a continuous conductive path in the NAND chain.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND chain can be considered to have a floating body channel because the length of the channel is not formed on a substrate. Further, the NAND chain is provided by a plurality of word line layers above one another in a stack, and separated from one another by dielectric layers.

FIG. 7A to 7C depict one example of a two-pass program operation, where FIG. 7A depicts a starting Vth distribution, FIG. 7B depicts a Vth distribution after a first program pass and FIG. 7C depicts a Vth distribution after a second program pass. In these figures, the vertical axis depicts a number of memory cells and the horizontal axis depicts a voltage. This example uses two-pass programming and eight assigned data states. Other options are possible, including more than two passes and a different number of data states. Initially, all memory cells are in the Er state, represented by the Vth distribution 800 (FIG. 7A). A first program pass is based on a lower page (LP) of write data. If LP=1, memory cells in the Er state remain in that state. If LP=0, memory cells are programmed from the Er state to an intermediate (INT) state, represented by a Vth distribution 802, using a verify voltage VvINT. See FIGS. 7B and 15A. The INT state may be between the erased state and the highest programmed state, e.g., the G state.

A second program pass is based on the UP and MP bits of data. If UP and MP are 1 and 1, respectively, memory cells in the Er state remain in that state and in the Vth distribution 800 in FIG. 7C, and memory cells in the INT state are programmed to the G state as represented by the Vth distribution 816. If UP and MP are 0 and 1, respectively, memory cells in the Er state are programmed to the A state as represented by the Vth distribution 810, and memory cells in the INT state are programmed to the F state as represented by the Vth distribution 815. If UP and MP are 0 and 0, respectively, memory cells in the Er state are programmed to the B state as represented by the Vth distribution 811, and memory cells in the INT state are programmed to the E state as represented by the Vth distribution 814. If UP and MP are 1 and 0, respectively, memory cells in the Er state are programmed to the C state as represented by the Vth distribution 812, and memory cells in the INT state are programmed to the D state as represented by the Vth distribution 813. Each data state is represented by a three bit sequence. For example, data states Er, A, B, C, D, E, F and G are represented by: 111, 011, 001, 101, 100, 000, 010 and 110. In each sequence, the UP bit is followed by the MP and LP bits.

The memory cells are programmed to the A, B, C, D, E, F and G states using verify voltages of VvA, VvB, VvC, VvD, VvE, VvF and VvG, respectively.

FIG. 8 depicts an example of a back and forth word line programming order which is compatible with the two-pass program operations of FIGS. 7A-7C and 9A-9C. As mentioned at the outset, a multi-pass program operation with a back and forth word line programming order can reduce the amount of neighbor word line disturb because the transition in Vth of a word line which can disturb an adjacent word line is reduced, compared to a single pass program operation. For example, in the final program pass, the transition of the memory cells in the Er Vth distribution 800 and the INT Vth distribution 802 of FIG. 7B is no more than three data states. In contrast, in a single pass program operation, the maximum transition is seven data states—from the Er state to the G state. Another advantage of a multi-pass program operation with a back and forth word line programming is that short term data retention is improved.

The circled numbers depict the steps in an example back and forth word line programming order. As an example, the memory cells of WL1 and WL2 of FIG. 2 are repeated. The first step is a first program pass for WL1, referred to more generally as WLn, involving a transition from the Vth distribution 800 of FIG. 7A to the Vth distributions 800 and 802 of FIG. 7B. The second step is a first program pass for WL2, referred to more generally as WLn+1, involving the same transitions as the first step. The third step is a second program pass for WL1, involving a transition from the Vth distribution 800 of FIG. 7B to the Vth distributions 800 and 810-812 of FIG. 7C, and a transition from the Vth distribution 802 of FIG. 7B to the Vth distributions 813-816 of FIG. 7C. The fourth step is a second program pass for WL2, involving the same transitions as the third step. This concept could be extend to three or more passes as well. In general, the variable Vread as discussed herein can be applied on the last program pass.

FIG. 9A to 9C depict another example of a two-pass program operation, where FIG. 9A depicts a starting Vth distribution, FIG. 9B depicts a Vth distribution after a first, foggy program pass, and FIG. 9C depicts a Vth distribution after a second, fine program pass. A foggy-fine program operation can involve a first (foggy) pass in which the memory cells are programmed from the Er state to respective offset voltages below the final states, followed by a second (fine) pass in which the memory cells are programmed from the offset voltages to the final states. The offset verify voltages are at a specified increment below the respective final verify voltages. This increment can be the same for all states or differ among different states.

For example, FIG. 9B depicts programming in the first pass from the Er state 900 of FIG. 9A to offset voltages which are represented by Vth distributions 901-907 and offset verify voltages VvAL, VvBL, VvCL, VvDL, VvEL, VvFL and VvGL, respectively. Some cells can remain in the Er state in the first program pass. The Vth distributions after the first program pass are relatively wide.

FIG. 9C depicts programming in the second pass from the foggy Vth distributions 900-907 of FIG. 9B to final states A-G which are represented by Vth distributions 911-917 and the final verify voltages VvA, VvB, VvC, VvD, VvE, VvF and VvG, respectively. Some cells can remain in the Er state in the second program pass. The Vth distributions after the second program pass are narrower than in the first program pass because the lower tail of the Vth distributions is moved up without moving up the upper tail. Only the memory cells with a Vth below the final verify voltage of their assigned data state are programmed and moved to within the Vth distribution of the remaining memory cells of the assigned data state.

This type of multi-pass program operation can also have a back and forth word line programming order. For example, a first step can involve a foggy program pass for WLn, a second step can involve a foggy program pass for WLn+1, a third step can involve a fine program pass for WLn, and a fourth step can involve a fine program pass for WLn+1. In general, the variable Vread as discussed herein can be applied on the fine program pass. In one option, the variable Vread is not lowered as much as in the example of FIG. 7A-7C because the amount of disturb is reduced due to the relatively small Vth upshift in the second program pass.

Figure 17:
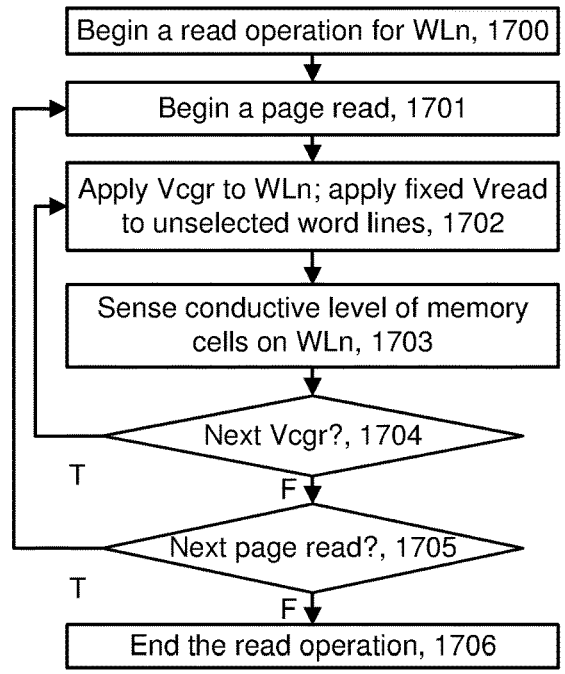
FIG. 17 depicts an example read operation.

FIG. 9C also depicts read voltages VrA, VrB, VrC, VrD, VrE, VrF and VrG for reading data states of the memory cells in a read operation such as in FIG. 17.

Figure 10A:
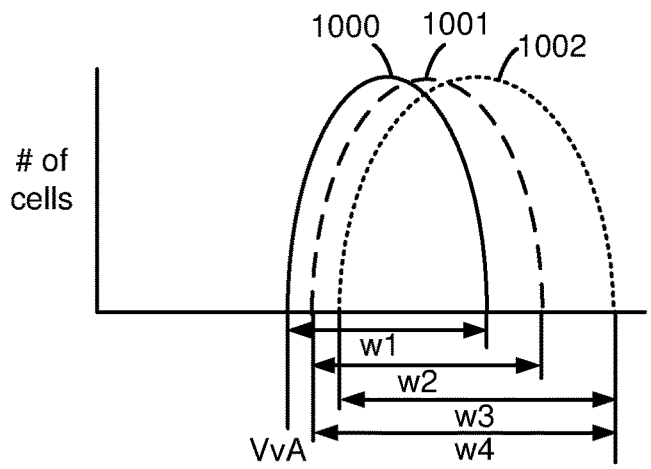
FIG. 10A depicts Vth distributions of an example data state, including a distribution 1000 after a final program pass on WLn but before a disturb due to a final program pass on WLn+1, a distribution 1001 after a disturb due to the final program pass on WLn+1 when the WLn+1 memory cell is programmed from the Er state to the A-C state, and a distribution 1002 after a disturb due to a final program pass on WLn+1 when the WLn+1 memory cell is programmed from the INT state to the D-G state, where a fixed Vread is applied on WLn+1 during verify tests of the final program pass of WLn.

FIG. 10A depicts Vth distributions of an example data state, including a distribution 1000 after a final program pass on WLn but before a disturb due to a final program pass on WLn+1, a distribution 1001 after a disturb due to the final program pass on WLn+1 when the WLn+1 memory cell is programmed from the Er state to the A-C state, and a distribution 1002 after a disturb due to a final program pass on WLn+1 when the WLn+1 memory cell is programmed from the INT state to the D-G state, where a fixed Vread is applied on WLn+1 during verify tests of the final program pass of WLn. The example data state is the A state with a verify voltage VvA in FIG. 10A-10C, but the examples applies to other data states as well. As mentioned, the final program pass on WLn+1 causes a disturb to the memory cells on WLn which have completed their final program pass. The disturb is greater when the final program pass on WLn+1 is a transition from the INT state to the D-G state, compared to a transition from the Er state to the A-C state. The Vth of each memory cell on WLn can therefore be classified into two Vth distributions according to whether the adjacent (same NAND string) memory cell on WLn+1 is in the Er state or the INT state at the start of the second program pass.

Due to the greater disturb caused by the INT state to the D-G state compared to the Er state to the A-C state programming, the width w3 of the Vth distribution 1002 is greater than the width w2 of the Vth distribution 1001 and the Vth distribution 1002 is higher than the Vth distribution 1001. The overall distribution of the WLn memory cells after the final program pass on WLn and WLn+1 is represented by the sum of the Vth distributions 1001 and 1002, where this sum results in a Vth distribution having a width of w4. The width of the Vth distribution 1000, w1, may be less than w2. Generally, w4>w3>w2>w1.

Figure 10B:
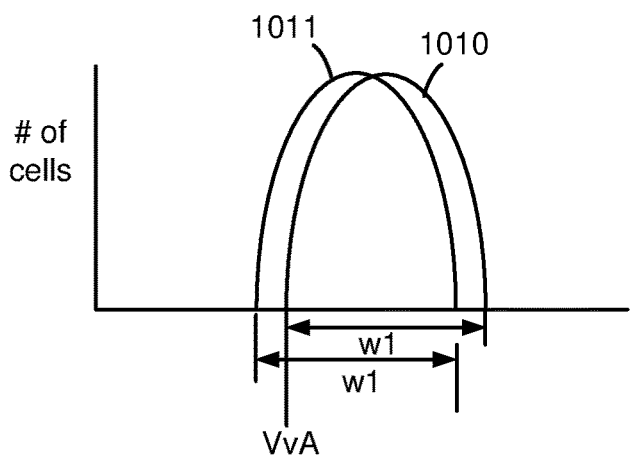
FIG. 10B depicts Vth distributions of an example data state, including a distribution 1010 after a final program pass on WLn but before a disturb due to a final program pass on WLn+1 when the WLn+1 memory cell is in the erased state, and a distribution 1011 before a disturb due to a final program pass on WLn+1 when the WLn+1 memory cell is in the INT state, where a reduced Vread is applied on WLn+1 during verify tests of the final program pass of WLn.

FIG. 10B depicts Vth distributions of an example data state, including a distribution 1010 after a final program pass on WLn but before a disturb due to a final program pass on WLn+1 when the WLn+1 memory cell is in the erased state, and a distribution 1011 before a disturb due to a final program pass on WLn+1 when the WLn+1 memory cell is in the INT state, where a reduced Vread is applied on WLn+1 during verify tests of the final program pass of WLn. The width of the Vth distributions 1010 and 1011 may be similar to one another, and similar to the width w1 of the Vth distribution 1000 of FIG. 10A.

Figure 10C:
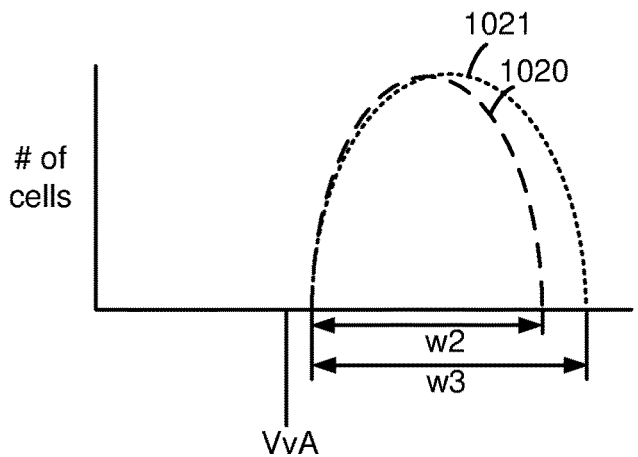
FIG. 10C depicts Vth distributions of an example data state which follow the distributions of FIG. 10B, including a distribution 1020 which represents an increase in the distribution 1010 of FIG. 10B after a disturb due to the final program pass on WLn+1 when the WLn+1 memory cell is programmed from the Er state to the A-C state, and a distribution 1021 which represents an increase in the distribution 1011 of FIG. 10B after a disturb due to the final program pass on WLn+1 when the WLn+1 memory cell is programmed from the INT state to the D-G state.

FIG. 10C depicts Vth distributions of an example data state which follow the distributions of FIG. 10B, including a distribution 1020 which represents an increase in the distribution 1010 of FIG. 10B after a disturb due to the final program pass on WLn+1 when the WLn+1 memory cell is programmed from the Er state to the A-C state, and a distribution 1021 which represents an increase in the distribution 1011 of FIG. 10B after a disturb due to the final program pass on WLn+1 when the WLn+1 memory cell is programmed from the INT state to the D-G state. The Vth distributions 1020 and 1021 may have widths of about w2 and w3, respectively. These widths are the same as the widths of the distributions 1001 and 1002, respectively, of FIG. 10A, but the Vth distribution 1020 falls within the Vth distribution 1021 so that the width of the overall Vth distribution is only w3 (less than w4 in FIG. 10A). The Vth distribution is therefore narrowed using the techniques described herein. The upshift in both the lower and upper tails of the Vth distributions should be set to minimize the overall Vth distribution.

Figure 11:
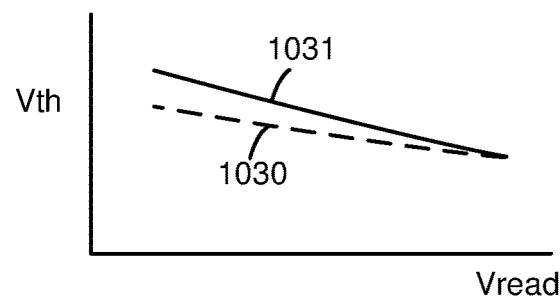
FIG. 11 depicts a plot of Vth for memory cells connected to WLn versus Vread on WLn+1, including a plot 1030 which represents a Vth of a WLn memory cell when a WLn+1 memory cell is in the Er state and a plot 1031 which represents a Vth of a WLn memory cell when a WLn+1 memory cell is in the INT state.

FIG. 11 depicts a plot of Vth for memory cells connected to WLn versus Vread on WLn+1, including a plot 1030 which represents a Vth of a WLn memory cell when a WLn+1 memory cell is in the Er state and a plot 1031 which represents a Vth of a WLn memory cell when a WLn+1 memory cell is in the INT state. The plots demonstrate that there is a greater upshift in the Vth for memory cells connected to WLn when a WLn+1 memory cell is programmed from the INT state to the D-G state, than when a WLn+1 memory cell is programmed from the Er state to the A-C state. Additionally, this difference is more pronounced when Vread is lowered. The techniques described herein take advantage of this effect by lowering Vread to create a differential in the Vth distributions as depicted in FIG. 10B.

The slopes and levels of the plots of FIG. 11 could be modified based on the number of P-E cycles.

Figure 12:
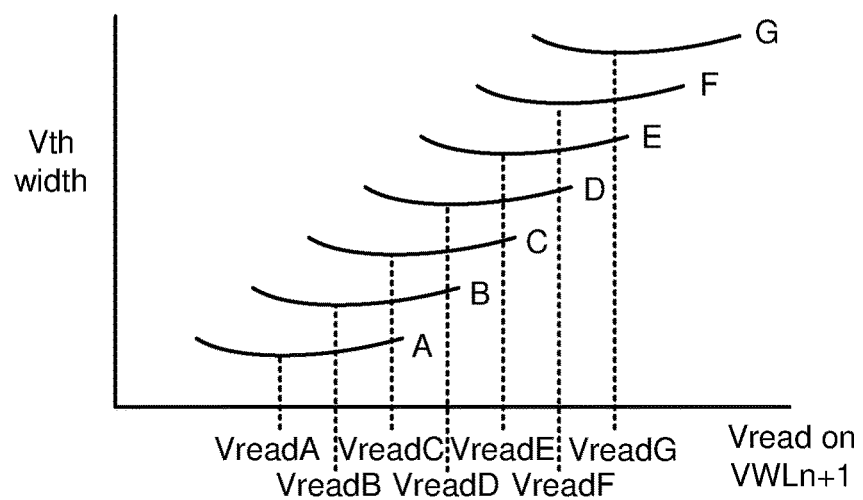
FIG. 12 depicts a plot of Vth width of memory cells on WLn versus Vread on WLn+1 during the final pass of a multi-pass program operation, showing how Vread can be optimized for each data state.

FIG. 12 depicts a plot of Vth width of memory cells on WLn versus Vread on WLn+1 during the final pass of a multi-pass program operation, showing how Vread can be optimized for each data state. VreadA to VreadG represent optimal levels of Vread on WL+1 during a final program pass on WLn, when the verify voltage on WLn is used for a verify test of the A-G data states, respectively (e.g., when the verify voltage on WLn is VvA to VvG, respectively). Tests can be performed using different levels of Vread to determine an optimal level, e.g., which results in a smallest number of read errors.

Figure 13:
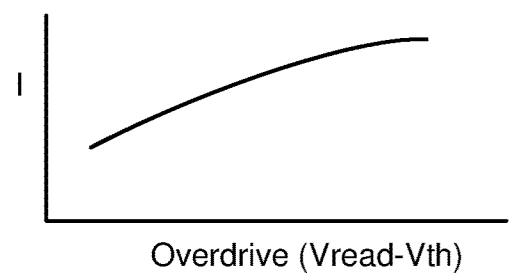
FIG. 13 depicts a plot of NAND string current versus overdrive (Vread-Vth) for WLn+1 memory cells during verify tests for WLn memory cells during the final program pass of a multi-pass program operation for WLn, showing how the lockout Vth of a WLn memory cell can be adjusted by adjusting the overdrive.

FIG. 13 depicts a plot of NAND string current versus overdrive (Vread-Vth) for WLn+1 memory cells during verify tests for WLn memory cells during the final program pass of a multi-pass program operation for WLn, showing how the lockout Vth of a WLn memory cell can be adjusted by adjusting the overdrive. Reducing Vread results in reducing the overdrive, and in reducing the current which flows in a NAND string during a verify test. During a verify test, the current is sensed to determine whether the Vth of the memory cells on WLn exceed the verify voltage which is applied to WLn. However, this assumes the unselected memory cells on the NAND strings are in a strongly conductive state, e.g., have a high overdrive. By lowering the overdrive, the WLn+1 cells will be in a less strongly conductive state, so the WLn memory cells will be judged by the sense circuits to pass the verify test relatively sooner in the program pass. That is, the WLn memory cells will pass the verify test with a relatively lower Vth when the overdrive on the WLn+1 memory cells is relatively lower. The WLn memory cells may pass the verify test at an earlier program loop in the program pass, for example.

The amount of overdrive is also a function of the Vth of the WLn+1 memory cells. For a given Vread, when the Vth is higher, the overdrive is lower and the WLn+1 memory cells will pass the verify test relatively sooner. Thus, in the final program pass, the overdrive is higher or lower when the memory cells of WLn+1 are in the Er state or INT states, respectively.

FIG. 14A depicts a plot of Vread (VWLn+1) on WLn+1 during verify tests for WLn memory cells during the final program pass of a multi-pass program operation for WLn, showing how Vread is variable and is an increasing function of the verify voltage, where a different VWLn+1 is provided for each different verify voltage. In FIG. 14A-14C, the vertical axis depicts VWLn+1, the voltage on WLn+1, and the horizontal axis depicts the verify voltage Vverify on WLn.

In a first approach, represented by the solid lines, each successive level of Vread is separated by a voltage step d, which is the same as a separation between each successive level of the verify voltages. This approach provides an equal margin (s1, FIG. 14D) between VWLn+1 and the verify voltage for each verify voltage. In this example, for each of the verify voltages, a difference by which the variable voltage exceeds the verify voltage is a constant.

In a second approach, represented by the dotted lines, each successive level of Vread is separated by a different voltage step, and the steps are larger for the lower verify voltages than for the higher verify voltages. For example, the steps may range from a largest value of d1 to a smallest value of d2. This approach provides a larger margin between VWLn+1 and the verify voltage on WLn for lower verify voltages. VreadA-VreadG are applied to WLn+1 when the verify voltages VvA-VvG, respectively, are applied to WLn. See also FIG. 18A. In the second approach, for each of the verify voltages, a difference by which the variable voltage exceeds the verify voltage decreases as the verify voltage increases.

Each successive level of Vread can be separated by a voltage step which is not the same (can be larger or smaller) as a separation between each successive level of the verify voltage.

FIG. 14B depicts a plot of Vread on WLn+1 during verify tests for WLn memory cells during the final program pass of a multi-pass program operation for WLn, showing how Vread is variable and is an increasing function of the verify voltage, where the number of different verify voltages (e.g., 7) is greater than the number of different levels (e.g., 3) of the variable voltage on WLn+1 in a program loop. This example provides a simpler implementation than in FIG. 14A because there are fewer levels of VWLn+1. For example, VreadA is applied to WLn+1 when VvA is applied to WLn, VreadB is applied to WLn+1 when VvB is applied to WLn, VreadD is applied to WLn+1 when VvC and VvD are applied to WLn, and VreadG is applied to WLn+1 when VvE-VvG are applied to WLn. This approach provides a data state-specific Vread for the lower data states which may be more susceptible to neighbor word line interference, while a Vread may be shared among multiple higher data states which may be less susceptible to neighbor word line interference. Also in this example, the step size between successive levels of Vread increases as Vverify increases. For example, the step size from VreadA to VreadB is d, the step size from VreadB to VreadD is 2d, and the step size from VreadD to VreadG is 3d.

Note that the example of FIG. 14A-14C shows Vverify increasing step-wise with time. However, other approaches are possible. For example, Vverify could decrease with time. Also, Vverify could be a continuous ramp waveform rather than varying in steps.

FIG. 14C depicts a plot of Vread on WLn+1 during verify tests for WLn memory cells during the final program pass of a multi-pass program operation for WLn, showing how Vread is variable and is an increasing function of the verify voltage, where there are two levels of VWLn+1 in a simplified implementation. In this example, VreadA is shared among multiple lower data states (e.g., A-C) and VreadG is shared among multiple higher data states (e.g., D-G). Further, the separation between VreadA and VreadA is 6d.

FIG. 14D depicts a plot of Vread on WLn+1 versus Vverify, for a case where a difference (s1) by which the variable voltage exceeds the verify voltage is a constant (solid lines) and a case where a difference by which the variable voltage exceeds the verify voltage decreases (e.g., from s2 to s1) as the verify voltage increases (dotted line). In one embodiment, the different voltages applied to the adjacent memory cell on WLn+1 exceed the different verify voltages applied to the selected memory cell on WLn by a fixed amount (s1). In another embodiment, the different voltages applied to the adjacent memory cell exceed the different verify voltages applied to the selected memory cell by varying amounts (s2, s1). During programming of WLn in FIG. 8, the selected memory cells are 230-241 and the adjacent unselected memory cells on WLn+1 are 210-221, respectively (see FIG. 8). This approach provides a larger reduction in Vread for lower states which may be more susceptible to disturbs.

FIG. 14E depicts a plot of Vread on WLn+1 during verify tests for WLn memory cells during the final program pass of a multi-pass program operation for WLn, where Vread is adjusted based on a number of P-E cycles. In one approach, as P-E cycles are accumulated, the memory cells typically become easier to program and are more susceptible to program disturb. As a result, the reduced data state-specific Vread levels described herein can be adjusted based on the number of P-E cycles in a block or other set of memory cells. In one approach, Vread decreases (solid lines) as the P-E cycles increase to provide an earlier lockout of the WLn memory cells, and a corresponding lower Vth, in preparation for a larger Vth upshift due to neighbor word line interference. However, the optimal adjustment in Vread based on P-E cycles can vary. In another approach, Vread increases (dashed lines) as the P-E cycles increase.

Further, the adjustment to Vread as a function of P-E cycles can be different for the different levels of Vread. In one approach, the Vread levels used for the lower data states are adjusted to a greater degree than the Vread levels used for the higher data states, as shown. A control circuit may be configured to set the variable Vread voltages as a decreasing function of a number of P-E cycles of the set of memory cells.

FIG. 15A depicts a voltage signal used in the first program pass of FIG. 7B. The horizontal axis denotes a program loop (PL) number, ranging from 1-8, and the vertical axis denotes voltage. The first program pass is similar to the second program pass of FIG. 15B except typically a larger initial program voltage, Vpgm_init1 (>Vpgm_int2), is used, a larger step size may be used, and the operation may be completed in fewer program loops. The voltage signal 1550 includes a series of program voltages, including an initial program voltage 1551, which are applied to a word line which is selected for programming. The verify voltage in each program loop, including example verify voltage 1552, has a level of VvINT.

FIG. 15B depicts a voltage signal used in a second program pass of FIG. 7C. The horizontal axis denotes a program loop number, ranging from 1-22, and the vertical axis denotes voltage. During a program pass, program loops are performed for a selected word line. A program loop comprises a program portion in which a program voltage or pulse is applied to the selected word line followed by a verify portion in which a verify voltage is applied to the selected word line while one or more verify tests are performed for the associated memory cells. A conductive level of the memory cells is sensed by the sense circuit during each verify test. When the Vth of a memory cell is increased to the point that the memory cell judged to be in a non-conductive state, the memory cell passes the verify tests and is locked out from further programming in the program pass. When the conductive level exceeds a reference level in the sense circuit, the memory cell is in a conductive state. When the conductive level does not exceed the reference level, the memory cell is in a non-conductive state.

Other than the erased state, each assigned data state has a verify voltage which is used in the verify test for the state in a program operation. The voltage signal 1500 includes a series of program voltages, including an initial program voltage 1501, which are applied to a word line selected for programming In this example, the voltage signal includes program voltages which increase stepwise in amplitude in program loops of a program pass using a fixed or varying step size. This is referred to as incremental step pulse programming, where the program voltage starts at an initial level Vpgm_int2 (see program voltage 1501) and increases in a step in each successive program loop, for instance, until the program pass is completed. A successful completion occurs when the threshold voltages of the selected memory cells reach the verify voltages of the assigned data states.

A program operation can include multiple program passes, where each pass uses incremental step pulse programming, for instance.

The verify signal in each program loop, including example verify signal 1502, can include one or more verify voltages, based on the assigned data states which are being verified for the program loop. The verify tests can encompass lower assigned data states and then midrange assigned data states and then higher assigned data states as the program pass proceeds. The example verify signals depict three verify voltages as a simplification.

All memory cells may initially be in the erased state at the beginning of a program operation, for instance. After the program operation is completed, a Vth distribution similar to that in FIG. 7C or 9C is achieved, and the data can be read from the memory cells using read voltages which are between the Vth distributions. At the same time, a fixed read voltage (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is provided in FIG. 7C. The data of the lower page can be determined by reading the memory cells using VrD, the data of the middle page can be determined by reading the memory cells using VrB and VrF, and the data of the upper page can be determined by reading the memory cells using VrA, VrC, VrE and VrG. See also FIG. 18B.

In the foggy-fine program technique of FIG. 9A-9C, a program waveform similar to the voltage signal 1500 can be used in both program passes, in one approach.

Figure 16A:
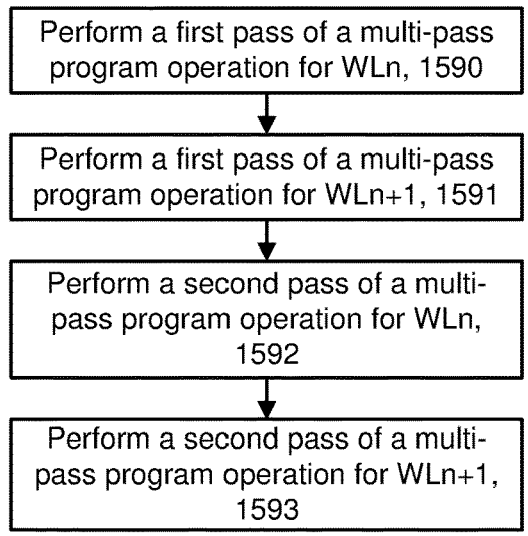
FIG. 16A depicts an example process for performing a multi-pass program operation.

FIG. 16A depicts an example process for performing a multi-pass program operation. See also FIG. 8. Step 1590 includes performing a first pass of a multi-pass program operation for WLn. Step 1591 includes performing a first pass of a multi-pass program operation for WLn+1. Step 1592 includes performing a second pass of a multi-pass program operation for WLn. Step 1593 includes performing a second pass of a multi-pass program operation for WLn+1.

Figure 16B:
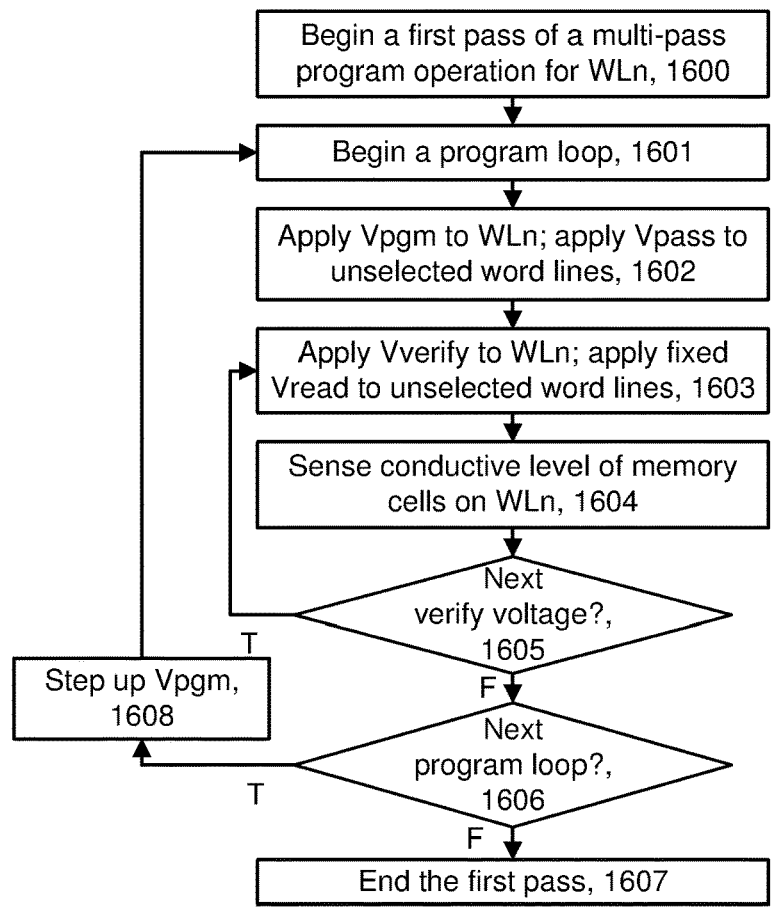
FIG. 16B depicts an example process for performing a first pass of a multi-pass program operation, consistent with step 1590 of FIG. 16A.

FIG. 16B depicts an example process for performing a first pass of a multi-pass program operation, consistent with step 1590 of FIG. 16A. Step 1600 begins a first pass of a multi-pass program operation for a word line WLn. Step 1601 begins a program loop in the pass. Step 1602 includes applying the program voltage Vpgm to WLn while concurrently applying a pass voltage (Vpass), e.g., 8-10 V to the unselected word lines. Step 1603 includes applying a verify voltage Vverify to WLn while concurrently applying a fixed Vread to the unselected word lines. The fixed Vread may be independent of the data state being verify on WLn. Note that different levels of the fixed Vread can be used on different unselected word lines. In one approach, WLn-1 and WLn+1 receive a higher Vread than the remaining unselected word lines. This is done to ensure that the associated memory cells are strongly conductive during sensing of the WLn memory cells. Due to the verify voltage on WLn being lower than the nominal Vread, the larger Vread on WLn-1 and WLn+1 compensates for the corresponding reduction in coupling from WLn to WLn-1 and WLn+1. This is in the first program pass, or otherwise before the final program pass, when Vread is not intentionally lowered on WLn+1 to reduce the overdrive on WLn+1, in one embodiment.

Step 1604 includes sensing the conductive level of the memory cells on WLn. Steps 1603 and 1604 may be concurrent. A decision step 1605 determines if there is a next verify voltage in the program loop. If the decision step 1605 is true, step 1603 is repeated with the next verify voltage. If the decision step 1605 is false, a decision step 1606 is reached. The decision step 1606 determines whether there is a next program loop in the program pass. If the decision step 1606 is true, step 1608 involves stepping up Vpgm and step 1601 is repeated in a next program loop. Typically, the program pass is completed when all, or nearly all, of the memory cells have passed their respective verify tests and reached the lockout condition. If the decision step 1606 is false, the first pass ends at step 1607.

Figure 16C:
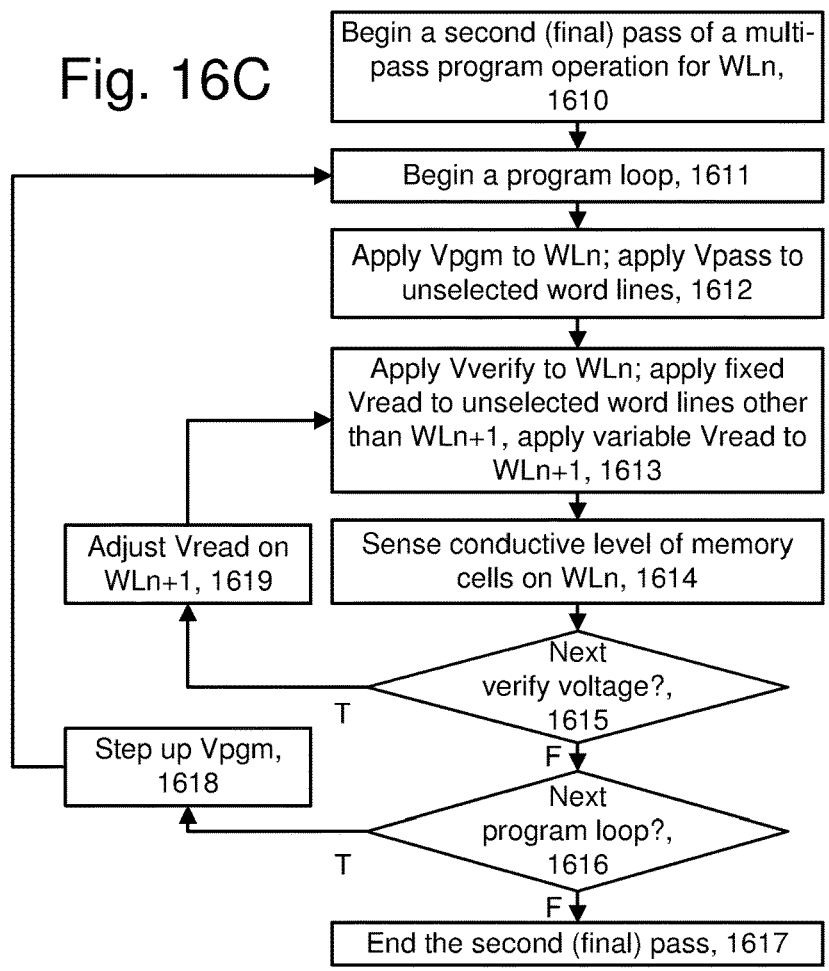
FIG. 16C depicts an example process for performing a second (final) pass of a multi-pass program operation, after the process of FIG. 16B, consistent with step 1592 of FIG. 16A.

FIG. 16C depicts an example process for performing a second (final) pass of a multi-pass program operation, after the process of FIG. 16B, consistent with step 1592 of FIG. 16A. Step 1610 begins a second (final) pass of a multi-pass program operation for a word line WLn. Step 1611 begins a program loop in the pass. Step 1612 includes applying Vpgm to WLn while concurrently applying Vpass to the unselected word lines. Step 1613 includes applying Vverify to WLn while concurrently applying a fixed Vread to the unselected word lines other than WLn+1, and applying a variable Vread to WLn+1. The variable Vread can be a function of the Vverify as mentioned, e.g., in connection with FIG. 14A-14C.

Step 1614 includes sensing the conductive level of the memory cells on WLn. Steps 1613 and 1614 may be concurrent. A decision step 1615 determines if there is a next verify voltage in the program loop. If the decision step 1615 is true, the Vread which is applied to WLn+1 is adjusted based on the level of the next Vverify at step 1619, and step 1613 is repeated with the next verify voltage. If the decision step 1615 is false, a decision step 1616 is reached. The decision step 1616 determines whether there is a next program loop in the program pass. If the decision step 1616 is true, step 1618 involves stepping up Vpgm and step 1611 is repeated in a next program loop. Typically, the program pass is completed when all, or nearly all, of the memory cells have passed their respective verify tests and reached the lockout condition. If the decision step 1616 is false, the first pass ends at step 1617.

In one approach, the technique for using a variable Vread as described herein may be omitted when programming the final program pass of a last-programmed data word line in a block since there is no later-programmed word line to cause neighbor word line interference. The technique can be used when programming all other data word lines in the block, in one approach.

FIG. 17 depicts an example read operation. Generally, the modification to the verify tests using a variable Vread on WLn+1 during the program operation allows the memory cells to be read later using a fixed Vread on the unselected word lines including WLn+1, in one approach. Step 1700 begins a read operation. The read operation can involve reading one or more pages of data, for example. Reading a page can involve sensing the conductive level of the memory cells for each of one or more control gate read voltages (Vcgr) which are applied to the selected word line WLn. Step 1701 begins a page read for a first page of data. Step 1702 includes applying Vcgr to WLn and concurrently applying a fixed Vread to the unselected word lines. See FIG. 18B, for example, which involves a read operation for three pages of data consistent with FIG. 7C. Vcgr may be first set to VrD, for example. Step 1703 includes sensing a conductive level of the memory cells on WLn.

A decision step 1704 determines if there is a next Vcgr in the page read. If the decision step 1704 is true, step 1702 is repeated with the next Vcgr of the page read. If the decision step 1704 is false, a decision step 1705 is reached. The decision step 1705 determines whether there is a next page read in the read operation. If the decision step 1705 is true, step 1701 is repeated by beginning a next page read. If the decision step 1705 is false, the read operation ends at step 1706.

Figure 18A:
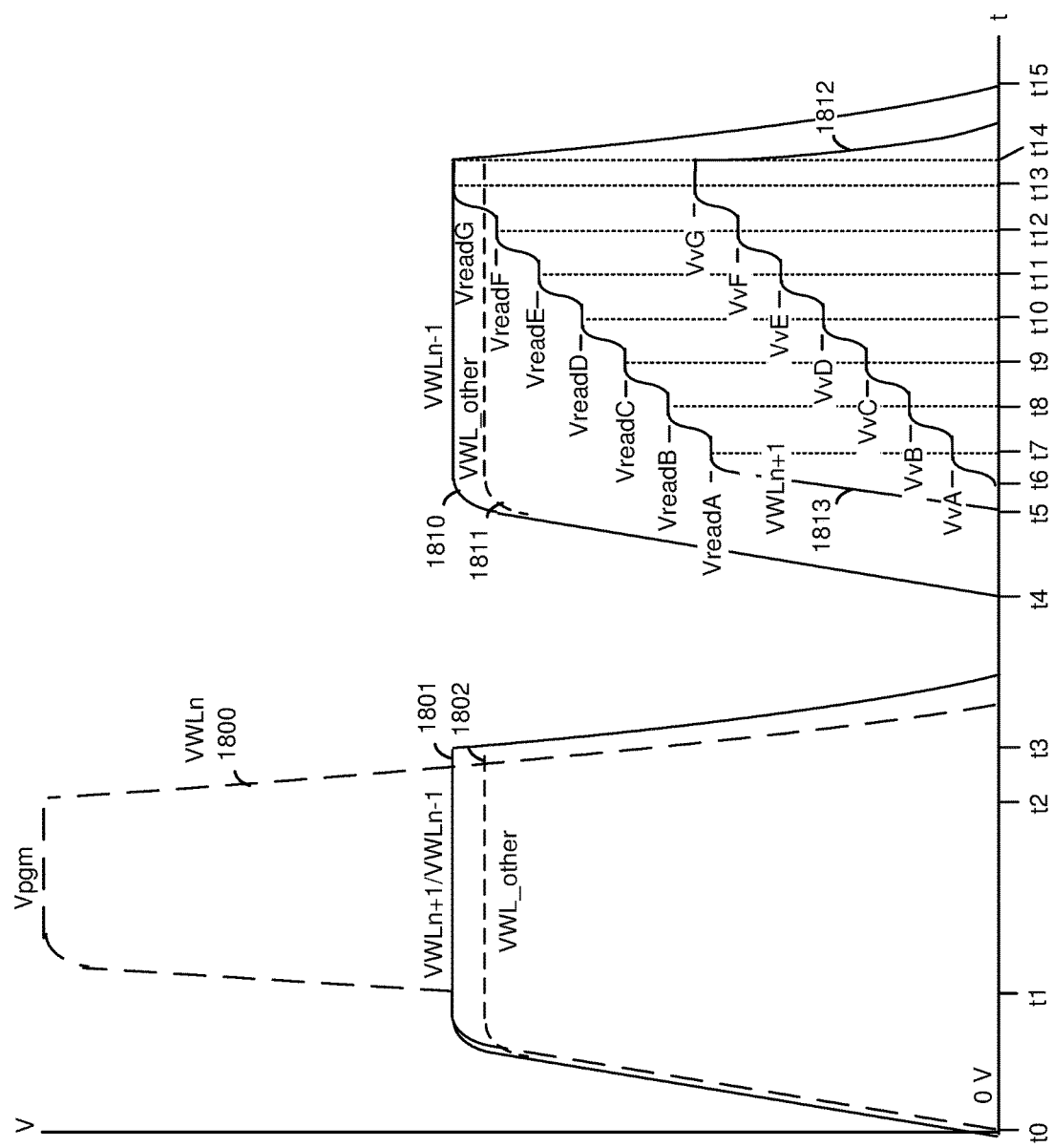
FIG. 18A depicts example waveforms in a program loop of a final program pass, consistent with FIG. 16C.

FIG. 18A depicts example waveforms in a program loop of a final program pass, consistent with FIG. 16C. The vertical axis depicts voltage and the horizontal axis depicts time. For comparison, the waveforms depict voltages which can be applied to both select and unselected word lines. The program loop includes a program portion from t0-t3 and a verify portion from t4-t15. In the program portion, a plot 1800 represents VWLn, the voltage applied to the selected word line, a plot 1801 represents VWLn+1 and VWLn−1, the voltage applied to the unselected word lines adjacent to WLn, on either side of WLn, and a plot 1802 represents VWL_other, the voltage applied to the other unselected word lines (other than WLn+1 and WLn−1). As mentioned, VWLn+1 and VWLn−1 can be slightly higher than WL_other. Vpgm can increase in a first step to a pass voltage level and then to a peak level in a second step. For example, Vpgm and the pass voltages of the unselected word lines can increase starting at t0. Vpgm can then step up again at t2. Vpgm and the pass voltages ramp back down to 0 V, for example, at t2 and t3, respectively.

The verify portion shows all of the verify voltages as an example but, in practice, fewer than all of the verify voltages may be applied in a given program loop. For example, as mentioned, verify voltages for lower data states may be applied during program loops which are early in a program pass, verify voltages for midrange data states may be applied during program loops which are midrange in the program pass, and verify voltages for higher data states may be applied during program loops which are later in the program pass.

A plot 1812 represent a verify voltage signal and includes voltages of VvA-VvG at t7-t13, respectively. A plot 1813 represents a Vread signal on WLn+1 (VWLn+1) and includes voltages of VreadA-VreadG at t7-t13, respectively. Sensing of the memory cells assigned to the A-G states occurs at t7-t13, respectively. A plot 1810 represents VWLn−1, the voltage on WLn-1 and a plot 1811 represents VWL_other, the voltage on the other unselected word lines, e.g., WL0 to WLn-2 and WLn+2 to WL47, for instance. The plots 1810 and 1811 may ramp up starting at t4 and ramp down starting at t14. The plots 1812 and 1813 may ramp up starting at t6 and t5, respectively, and ramp down starting at t14.

The plot 1813 shows that the variable Vread voltages range from a lowest level (e.g., VreadA) to a highest level (e.g., VreadG). The highest level maybe the same as the fixed voltage applied to WLn-1. That is, a control circuit may be configured to apply another voltage (VWLn−1) to a second adjacent word line (WLn−1) of the selected word line during the application of each verify voltage, where the another voltage is equal to the highest level of VWLn+1.

The techniques described herein can be performed without any time penalty since the change in Vread can be done at the same time as the change in Vverify.

Figure 18B:
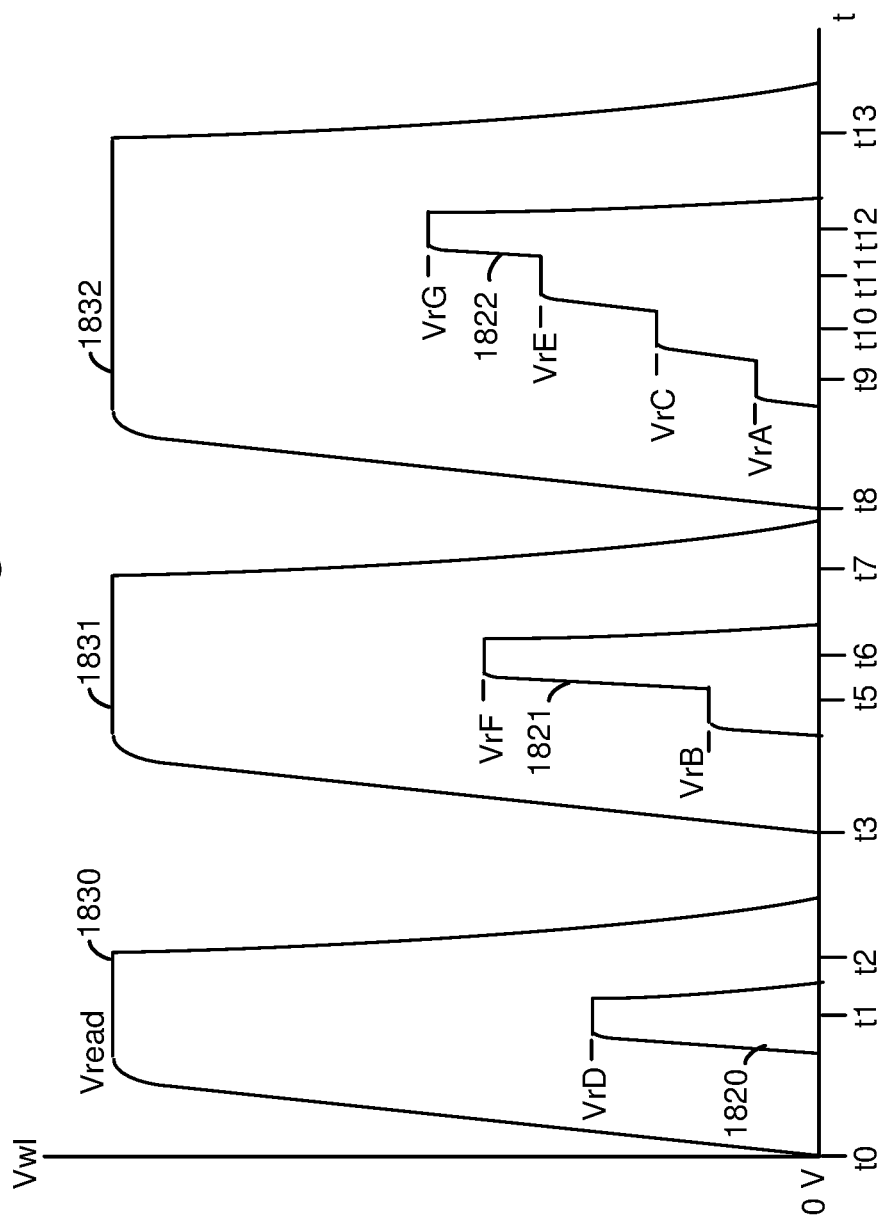
FIG. 18B depicts example waveforms in a read operation, consistent with FIG. 17.

FIG. 18B depicts example waveforms in a read operation, consistent with FIG. 17. This example involves reading three pages of data. A first, lower page is read on WLn using Vcgr=VrD at t1 (plot 1820). Vread (plot 1830) is ramped up on the unselected word lines starting at t0 and ramped down starting at t2. A second, middle page is read on WLn using Vcgr=VrB at t5 and Vcgr=VrF at t6 (plot 1821). Vread (plot 1831) is ramped up on the unselected word lines starting at t3 and ramped down starting at t7. A third, upper page is read on WLn using Vcgr=VrA at t9, Vcgr=VrC at t10, Vcgr=VrE at t11 and Vcgr=VrG at t12 (plot 1822). Vread (plot 1832) is ramped up on the unselected word lines starting at t8 and ramped down starting at t13.

In one implementation, an apparatus comprises: a set of memory cells arranged in NAND strings and connected to a plurality of word lines, the plurality of word lines comprising a selected word line and unselected word lines; and a control circuit. The control circuit to perform verify tests for memory cells connected to the selected word line in one program loop, is configured to apply a plurality of verify voltages (e.g., plot 1812 in FIG. 18A) in turn to the selected word line, and during the application of each verify voltage, sense a conductive level of the memory cells connected to the selected word line and apply a variable voltage (e.g., plot 1813 of VWLn+1 in FIG. 18A) to a first adjacent word line (WLn+1) of the selected word line, wherein the variable voltage is a first increasing function of the verify voltages (e.g., FIG. 14A-14C).

In another implementation, a method comprises: applying verify voltage signal to memory cells connected to a selected word line; and during the applying of the verify voltage signal, sensing the memory cells connected to the selected word line and applying a voltage signal to a first adjacent word line (WLn+1) of the selected word line, wherein the voltage signal applied to the first adjacent word line exceeds the verify voltage signal and steps up as the verify voltage signal steps up.

In another implementation, an apparatus comprises: a set of memory cells arranged in a NAND string, the set of memory cells comprising a selected memory cell and an adjacent memory cell; means for applying different verify voltages (e.g., VvA-VvG) to the selected memory cell during verify tests of a program loop; and means for applying different voltages (e.g., VreadA-VreadG) to the adjacent memory cell during the verify tests, when the different voltages are applied to the selected memory cell.

The means for applying different verify voltages may include the power control module 116 of FIG. 1, including the WLn driver 443, the row decoder 124 and the pass transistors 422 of FIG. 4, or other logic hardware, and/or other executable code stored on a computer readable storage medium or device. Other embodiments may include similar or equivalent means.

The means for applying different voltages to the adjacent memory cell may include the power control module 116 of FIG. 1, including the WLn+1 driver 444, the row decoder 124 and the pass transistors 422 of FIG. 4, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of memory cells arranged in NAND strings and connected to a plurality of word lines, the plurality of word lines comprising a selected word line and unselected word lines; and
   a control circuit, the control circuit to perform verify tests for memory cells connected to the selected word line in one program loop, is configured to apply a plurality of verify voltages in turn to the selected word line, and during the application of each verify voltage, sense a conductive level of the memory cells connected to the selected word line and apply a variable voltage to a first adjacent word line of the selected word line, wherein the variable voltage is a first increasing function of the verify voltages.

2. The apparatus of claim 1, wherein:
   for each of the verify voltages, a difference by which the variable voltage exceeds the verify voltage is a constant.

3. The apparatus of claim 1, wherein:
   for each of the verify voltages, a difference by which the variable voltage exceeds the verify voltage decreases as the verify voltage increases.

4. The apparatus of claim 1, wherein:
   the variable voltages range from a lowest level to a highest level;
   the control circuit is configured to apply another voltage to a second adjacent word line of the selected word line during the application of each verify voltage; and
   the another voltage is equal to the highest level.

5. The apparatus of claim 1, wherein:
   memory cells connected to the first adjacent word line are in at least two different threshold voltage distributions during the verify tests for the memory cells connected to the selected word line.

6. The apparatus of claim 1, wherein:
   the verify tests are performed in a final pass of a multi-pass program operation which uses a back and forth word line programming order; and
   the first adjacent word line is programmed after the selected word line in each pass of the multi-pass program operation.

7. The apparatus of claim 6, wherein:
   the multi-pass program operation comprises a next to last pass for the selected word line; and
   the control circuit, to perform verify tests for the memory cells connected to the selected word line in a program loop in the next to last pass, is configured to apply a plurality of verify voltages in turn to the selected word line, and during the application of each verify voltage, sense a conductive level of the memory cells connected to the selected word line and apply a fixed voltage to the first adjacent word line.

8. The apparatus of claim 6, wherein:
   the multi-pass program operation comprises a first pass for the selected word line in which the memory cells of the selected word line are kept in an erased state or programmed to an intermediate state, followed by a first pass for the first adjacent word line in which memory cells of the first adjacent word line are kept in the erased state or programmed to the intermediate state, followed by a second pass for the selected word line in which the memory cells of the selected word line are programmed from the erased state and the intermediate state to final states, followed by a second pass for the first adjacent word line in which the memory cells of the first adjacent word line are programmed from the erased state and the intermediate state to the final states.

9. The apparatus of claim 6, wherein:
   the multi-pass program operation comprises a first pass for the selected word line in which the memory cells of the selected word line are programmed to offset voltages below final states, followed by a first pass for the first adjacent word line in which memory cells of the first adjacent word line are programmed to the offset voltages below the final states, followed by a second pass for the selected word line in which the memory cells of the selected word line are programmed from the offset voltages to the final states, followed by a second pass for the first adjacent word line in which the memory cells of the first adjacent word line are programmed from the offset voltages to the final states.

10. The apparatus of claim 1, wherein:
    in the program loop, a number of the verify voltages is more than a number of different levels of the variable voltages.

11. The apparatus of claim 1, wherein:
    the verify voltages comprise a lowest level, a next to lowest level, a next to highest level and a highest level;
    the variable voltages comprise a lowest level, a next to lowest level and a highest level;
    the lowest level of the variable voltages is applied to the first adjacent word line when the lowest level of the verify voltages is applied to the selected word line;
    the next to lowest level of the variable voltages is applied to the first adjacent word line when the next to lowest level of the verify voltages is applied to the selected word line; and
    the highest level of the variable voltages is applied to the first adjacent word line when the next to highest level and the highest level of the verify voltages are applied to the selected word line.

12. The apparatus of claim 1, wherein:
    the control circuit is configured to set the variable voltages as a decreasing function of a number of program-erase cycles of the set of memory cells.

13. A method, comprising:
    applying verify voltage signal to memory cells connected to a selected word line; and
    during the applying of the verify voltage signal, sensing the memory cells connected to the selected word line and applying a voltage signal to a first adjacent word line of the selected word line, wherein the voltage signal applied to the first adjacent word line exceeds the verify voltage signal and steps up as the verify voltage signal steps up.

14. The method of claim 13, further comprising:

during the applying of the verify voltage signal, applying a voltage signal to a second adjacent word line of the selected word line, wherein the voltage signal applied to the second adjacent word line is fixed as the verify voltage signal steps up.

15. The method of claim 13, wherein:

the verify voltage signal is applied in a final pass of a multi-pass program operation for the selected word line which uses a back and forth word line programming order;

the first adjacent word line is programmed after the selected word line in each pass of the multi-pass program operation; and the first adjacent word line is partly but not fully programmed when the verify voltage signal is applied to the selected word line.

16. The method of claim 13, wherein:

a number of levels in the verify voltage signal is more than a number of levels of the voltage signal applied to the first adjacent word line.

17. An apparatus, comprising:

a set of memory cells arranged in a NAND string, the set of memory cells comprising a selected memory cell and an adjacent memory cell;

means for applying different verify voltages to the selected memory cell during verify tests of a program loop; and means for applying different voltages to the adjacent memory cell during the verify tests, when the different verify voltages are applied to the selected memory cell.

18. The apparatus of claim 17, wherein:

the different voltages applied to the adjacent memory cell exceed the different verify voltages applied to the selected memory cell by a fixed amount.

19. The apparatus of claim 17, wherein:

the different voltages applied to the adjacent memory cell exceed the different verify voltages applied to the selected memory cell by varying amounts.

20. The apparatus of claim 17, further comprising:

means for applying a fixed voltage to another adjacent memory cell of the selected memory cell during the verify tests.

* * * * *